(12) United States Patent
McMillan et al.

(10) Patent No.: US 8,569,110 B2
(45) Date of Patent: Oct. 29, 2013

(54) PRE-BONDED SUBSTRATE FOR INTEGRATED CIRCUIT PACKAGE AND METHOD OF MAKING THE SAME

(75) Inventors: John Robert McMillan, Fontana, CA (US); Xiao Yun Chen, Shenzhen (CN); Tung Lok Li, Hong Kong (CN)

(73) Assignee: QPL Limited, Hong Kong (HK)

( * ) Notice: Subject to any disclaimer, the term of this patent is extended or adjusted under 35 U.S.C. 154(b) by 28 days.

(21) Appl. No.: 13/111,982

(22) Filed: May 20, 2011

(65) Prior Publication Data

US 2012/0149154 A1 Jun. 14, 2012

Related U.S. Application Data

(60) Provisional application No. 61/421,616, filed on Dec. 9, 2010.

(51) Int. Cl.
*H01L 21/00* (2006.01)

(52) U.S. Cl.
USPC .................. 438/123; 438/124; 257/E21.506

(58) Field of Classification Search
None
See application file for complete search history.

(56) References Cited

U.S. PATENT DOCUMENTS

| 7,795,710 B2 | 9/2010 | Islam et al. |
| 7,820,480 B2 | 10/2010 | Islam et al. |
| 2009/0236711 A1 | 9/2009 | Lim et al. |
| 2011/0079888 A1* | 4/2011 | Bathan et al. ................. 257/676 |

* cited by examiner

*Primary Examiner* — Cheung Lee
(74) *Attorney, Agent, or Firm* — Eagle IP Limited; Jacqueline C. Lui

(57) ABSTRACT

A substrate and a method of making thereof are disclosed. The substrate comprises an electrically conductive leadframe, the leadframe having a plurality of lands on a first side of the leadframe with a first recessed portion between the lands, and a plurality of routing leads on an opposing second side of the leadframe with a second recessed portion between the routing leads. The substrate also comprises a first bonding compound filling the first recessed portion. In one embodiment, the substrate also comprises a support material attached to the first bonding compound for holding the leadframe together. In another embodiment, the substrate comprises a second bonding compound filling the second recessed portion.

32 Claims, 26 Drawing Sheets

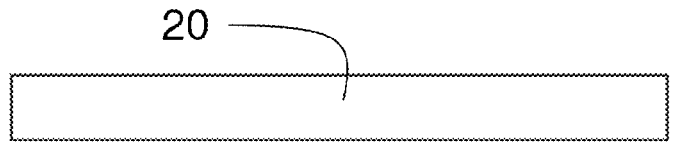
Fig. 2a
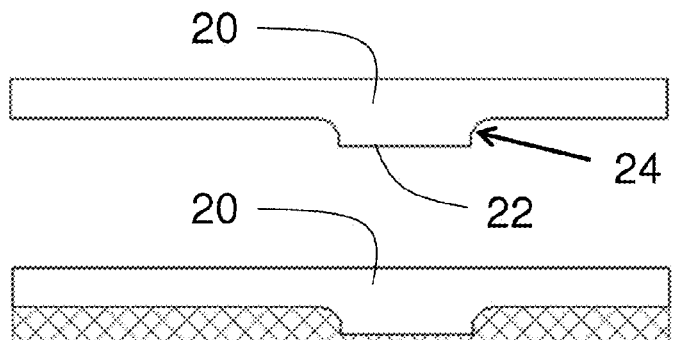
Fig. 2b
Fig. 2c
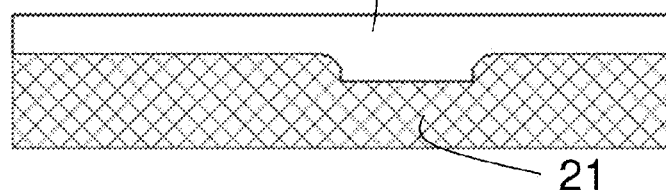
Fig. 2d
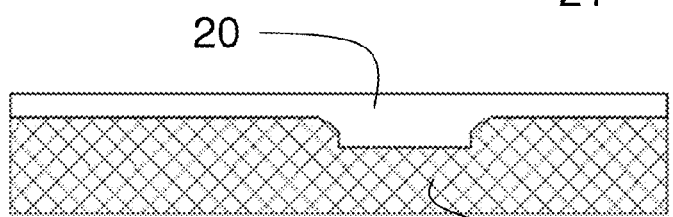
Fig. 2e
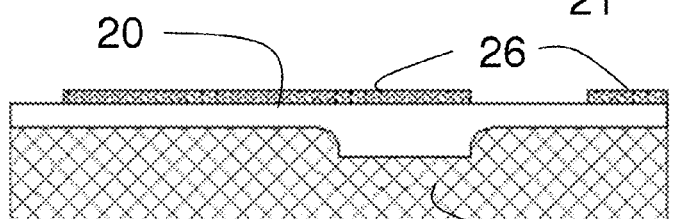
Fig. 2f
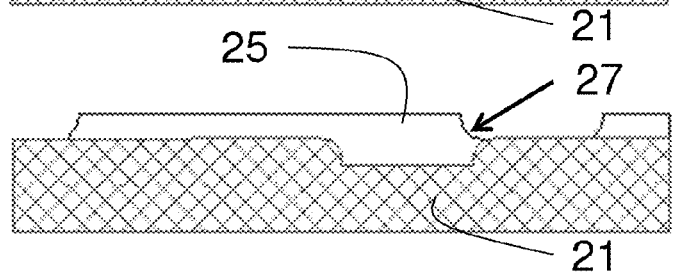
Fig. 2g
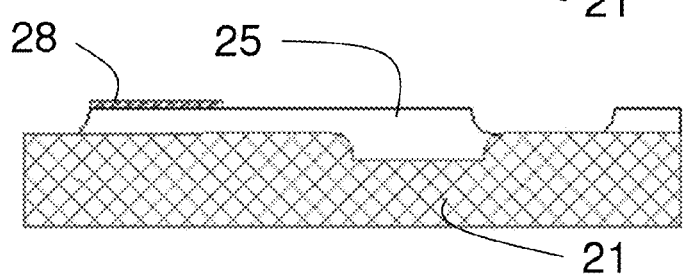

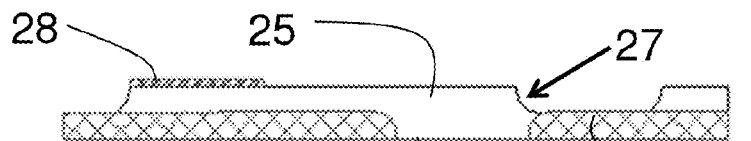
Fig. 8h
Fig. 8i
Fig. 8j
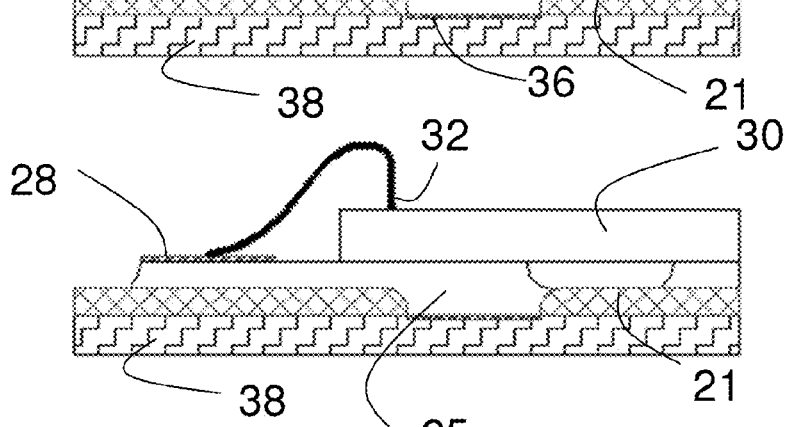
Fig. 8k
Fig. 8l
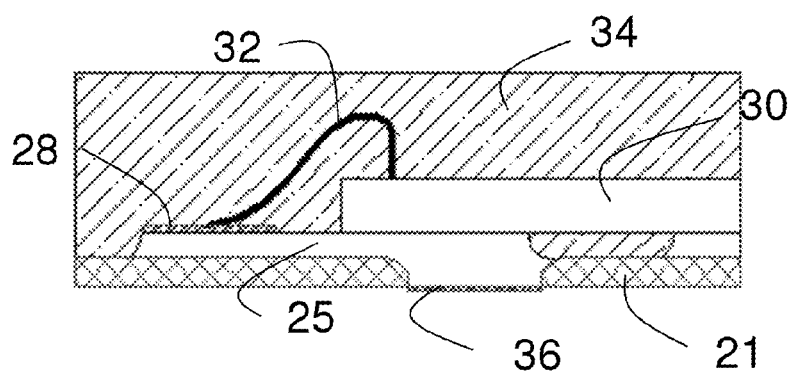
Fig. 8m

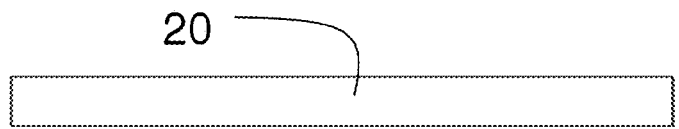
Fig. 17a
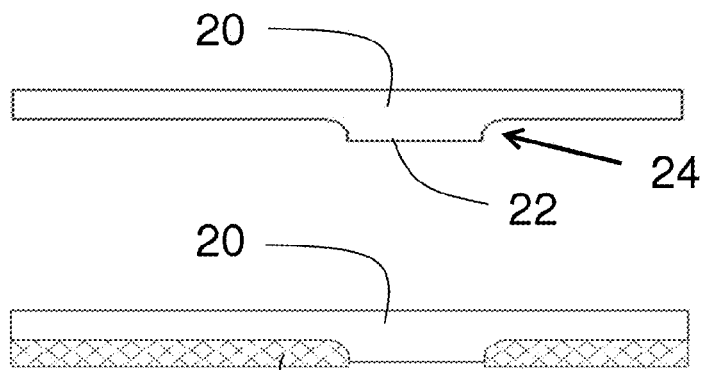
Fig. 17b
Fig. 17c
Fig. 17d
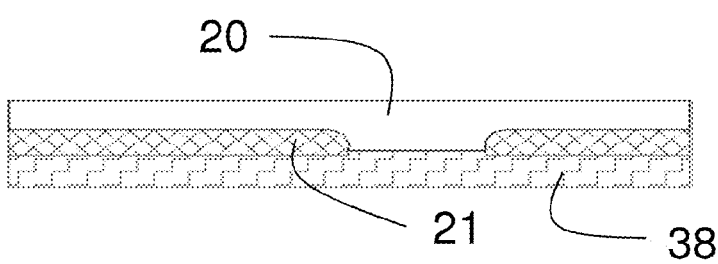
Fig. 17e
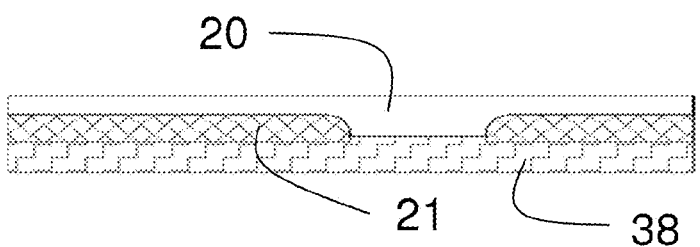
Fig. 17f
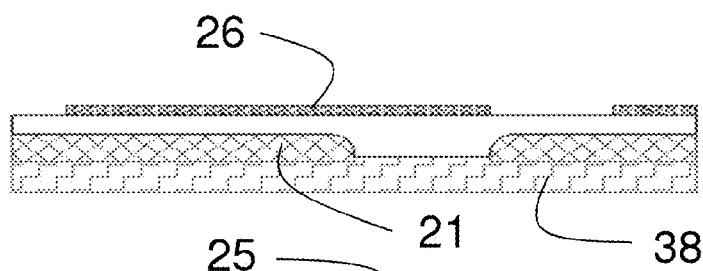
Fig. 17g

PRE-BONDED SUBSTRATE FOR INTEGRATED CIRCUIT PACKAGE AND METHOD OF MAKING THE SAME

FIELD OF INVENTION

This invention relates to an integrated circuit (IC) package, and in particular an IC package having a substrate with more than one encapsulation compound or process.

BACKGROUND OF INVENTION

IC packages or substrates having more than one encapsulation compound are known in the art, such as disclosed in U.S. Pat. No. 7,795,710. However, such an IC package may break during manufacturing and may have issues when operating in high temperatures or in environments that cycle between high and low temperatures.

SUMMARY OF INVENTION

In the light of the foregoing background, it is an object of the present invention to provide an alternate substrate and a method of making thereof.

Accordingly, the present invention, in one aspect, is a substrate comprising an electrically conductive leadframe, the leadframe having a plurality of lands on a first side of the leadframe with a first recessed portion between the lands, and a plurality of routing leads on an opposing second side of the leadframe with a second recessed portion between the routing leads. The substrate also comprises a first bonding compound having a first portion thereof filling the first recessed portion, and comprises a plurality of bonding pads disposed on the plurality of routing leads.

In an exemplary embodiment of the present invention, the first bonding compound has a coefficient of thermal expansion between 7 and 15.

In one embodiment of the present invention, the substrate further comprises a support material attached to the leadframe from the first side, the support material covering the first bonding compound and the plurality of lands. In a further embodiment, a plurality of solder pads is disposed on the plurality of lands therebefore, and as such the support material covers the plurality of solder pads.

In another embodiment, the substrate further comprises a second bonding compound disposed on the second side of the leadframe, the second bonding compound filling the second recessed portion.

In yet another embodiment, the first bonding compound further comprises a second portion covering the first portion and the plurality of lands.

According to another aspect of the present invention, a method of manufacturing a substrate is disclosed. The method first patterns a leadframe on a first side, forming a plurality of lands and a first recessed portion. A first bonding compound is then disposed on the first side of the leadframe, the first bonding compound having a first portion filling the first recessed portion. Then, the leadframe is patterned on an opposing second side forming a plurality of routing leads and a second recessed portion. Lastly, a plurality of bonding pads is disposed on the plurality of routing leads. The first bonding compound prevents displacement of the plurality of routing leads.

In one embodiment, the method further comprises the step of selectively disposing a non-conductive die attach material onto a predetermined area of the second side of said substrate, the die attach material filling the second recessed portion and covering the plurality of routing leads within said predetermined area.

There are many advantages to the present invention. One advantage is that the first bonding compound holds the leadframe together even after the routing leads are revealed, such that they will not fall off or displace during the subsequent steps of the manufacturing process, for example die attaching and wire bonding. The predetermined thickness of the first bonding compound ensures that the holding strength is strong enough for the subsequent steps.

Another advantage of the present invention is that the chance of the IC package made from such leadframe being damaged is reduced by the careful choice of the coefficient of thermal expansion of the first bonding compound. The coefficient of thermal expansion of the first bonding compound is chosen and designed to be between that of the semiconductor die and a conventional printed circuit board which is usually connected to the lands of the IC package through the solder joints. When the IC package connected to the conventional printed circuit board is exposed to high temperature extremes, the stress caused by the coefficient of expansion mismatch between the IC package and the printed circuit board is concentrated at the connecting solder joints therebetween. With a high amount of stress the solder connection may fracture. This stress can be reduced by having at least one transitional expansion rate material disposed between the die and printed circuit board. The first bonding compound with an expansion rate between that of the die and the printed circuit board will act as a buffer between the two expansion extremes and as such will result in a lower stress on the solder joints.

BRIEF DESCRIPTION OF FIGURES

FIG. 2a-2k is a cross-sectional view of an integrated circuit chip package at different steps of the process of FIG. 1.

FIG. 8a-8m is a cross-sectional view of an integrated circuit chip package at different steps of the process of FIG. 7.

FIG. 17a-l is a cross-sectional view of an integrated circuit chip package at different steps of the process of FIG. 16.

DETAILED DESCRIPTION OF THE PREFERRED EMBODIMENTS

As used herein and in the claims, "comprising" means including the following elements but not excluding others.

As used herein and in the claims, "couple" or "connect" refers to electrical coupling or connection either directly or indirectly via one or more electrical means unless otherwise stated.

As used herein and in the claims, "leadframe" or "substrate leadframe" means a structure made from an electrically conductive material, where other materials and compounds are added thereon to form a substrate. A "substrate" means a structure having a leadframe and additional materials or compounds, where a semiconductor die is attached thereto to form an IC package.

Figure 1:
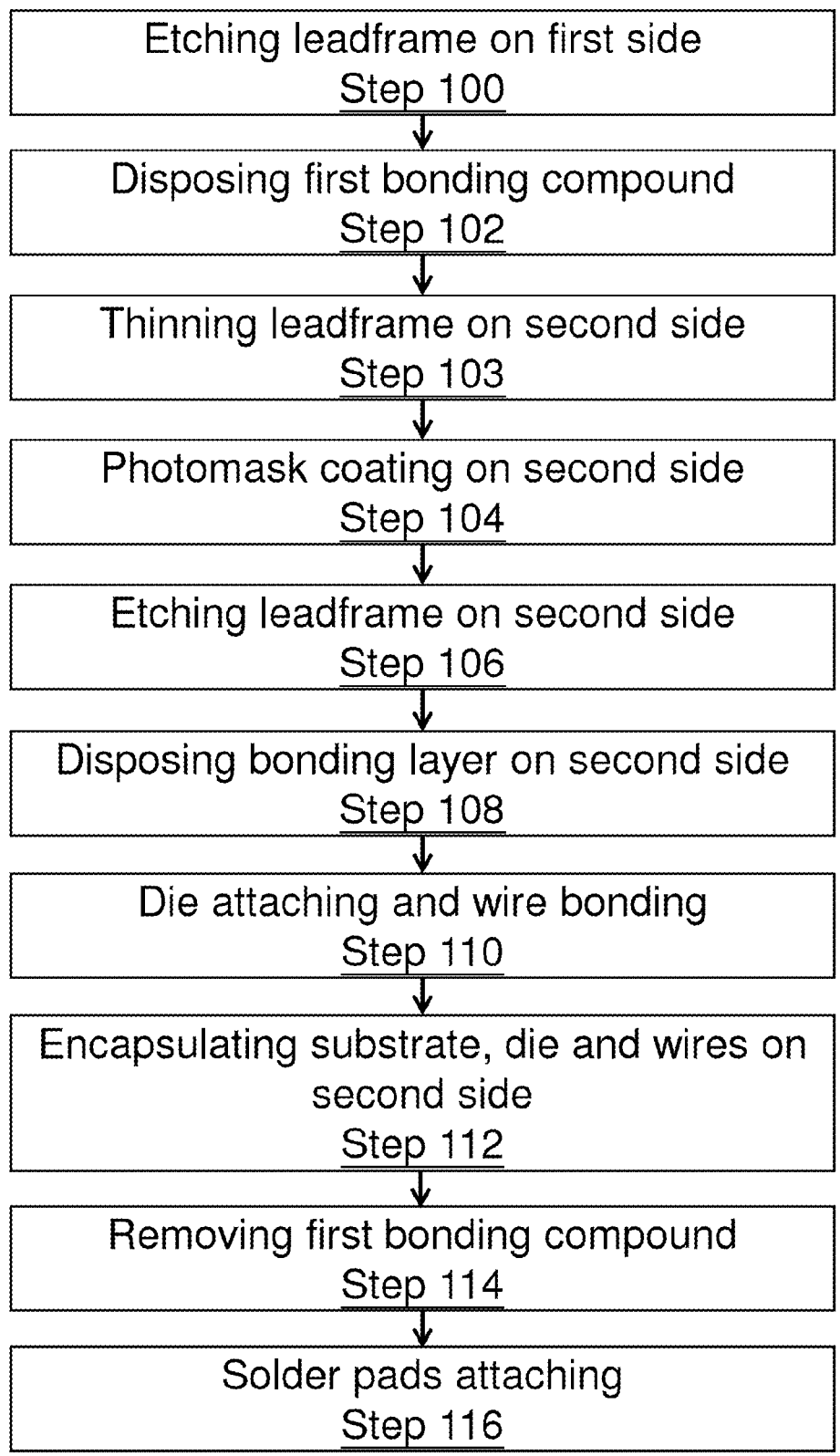
FIG. 1 is a flow chart of a process of manufacturing an integrated circuit chip package according to an embodiment of the present invention.
Figure 2H:
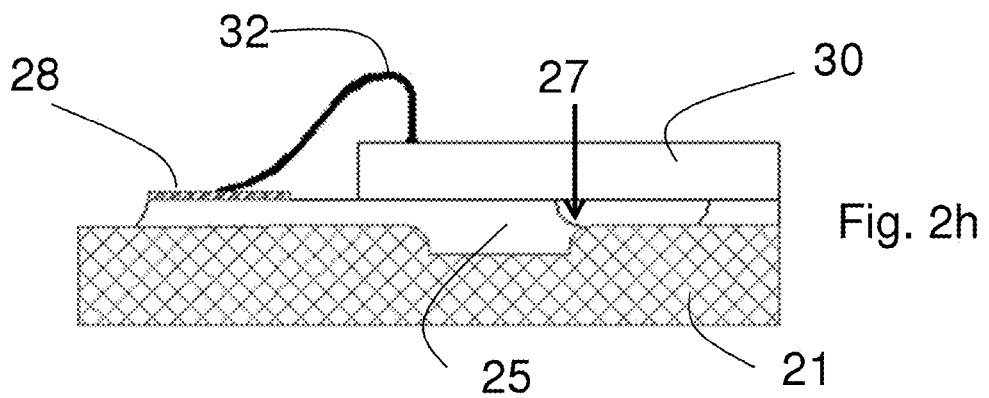

FIGS. 1 and 2a-2h shows a method of manufacturing a substrate and an IC package according to a first embodiment of the present invention. FIG. 2a shows an electrically conductive substrate leadframe 20, made from copper for example, at its initial state. In step 100, a first portion of the leadframe 20 is etched at a first side thereof to form a first pattern on the first side. The first pattern comprises a plurality of lands 22 on the surface of the first side, adapted to electrically connect to an external device, such as a printed circuit board, and also comprises a first recessed portion 24 which is recessed relative to the plurality of lands 22. The first pattern can alternately be called as the landing pattern. The substrate after step 100 is shown in FIG. 2b.

In step 102, a first bonding compound 21 is disposed on the first side of the leadframe 20. The bonding compound 21 fills the first recessed portion 24 and also covers the plurality of lands 22. In an exemplary embodiment, the first bonding compound 21 comprises a first portion that fills the first recessed portion 24 and being coplanar to the lands 22, and a second portion that extends beyond the first portion, covering the first recessed portion 24 and also the plurality of lands 22. In an exemplary embodiment, the first portion of the first bonding compound 21 is coplanar to the plurality of lands 22 at the first side of the leadframe 20. In an exemplary embodiment, the first bonding compound 21 covers the plurality of lands 22 by a predetermined thickness depending on various factors such as the size of the leadframe 20 and the depth of the first recessed portion 24. This step is also called prebonding, and the presence and the thickness of the first bonding compound 21 improves the ability to hold the leadframe 20 in place during subsequent steps of the manufacturing process, thereby preventing displacement of certain portions of the leadframe 20 as discussed below. The substrate after step 102 is shown in FIG. 2c.

In one embodiment, in step 103 the leadframe 20 is optionally thinned to a desired thickness. The thinning step can be performed either by etching the leadframe 20 from the second surface or other known methods. The substrate after step 103 is shown in FIG. 2d.

In step 104, a photomask 26 is coated onto the leadframe 20 at a second side of the leadframe. The photomask 26 defines a second pattern on the second side of the leadframe 20. In one embodiment, the second pattern comprises a plurality of routing leads 25, each leading from a bonding site to a corresponding land 22, and also comprises a second recessed portion 27 between and recessed relative to the routing leads 25. The photomask 26 can for example be blue ink or other materials known in the art. The substrate after step 104 is shown in FIG. 2e.

In step 106, the leadframe 20 is etched at the second side of the leadframe 20 to form the second pattern, or called the routing pattern. This etching process continues until the leadframe 20 is completely etched away at portions that are neither covered by the photomask 26 nor filled with the first bonding compound 21 at the first side, i.e. the second recessed portion 27 is adjoining the first recessed portion 24. This step reveals individual routing leads 25, with the first bonding compound 21 and the second recessed portion 27 completely surrounding each individual routing lead 25 thereby electrically separating the plurality of routing leads 25. The unmasked portion of the photomask 26 becomes the second recessed portion 27 between the plurality of routing leads 25 after etching. After this etching step, the first bonding compound 21 filling the first recessed portion 24 is exposed from the second side, and the plurality of routing leads 25 are held together only by the first bonding compound 21, as the leadframe 20 between the routing leads 25 is completely etched away and became the second recessed portion 27. Therefore, the first bonding compound 21 needs to be thick enough to prevent falling off or displacement of the routing leads 25. After etching, the photomask 26 is removed by conventional methods. The substrate after step 106 is shown in FIG. 2f.

In step 108, a bonding layer is disposed on the leadframe 20 at the second side, forming a plurality of bonding pads 28 on the plurality of bonding sites on the routing leads 25 for bonding to at least one semiconductor die. In various embodiments, the bonding pads 28 are made of gold, silver, nickel palladium gold or other metals or alloys known in the art. In a preferred embodiment, the disposition of the bonding layer is performed by electroless plating. In general, the substrate is considered finished when it has reached the state just before the die attaching step, for example as shown in FIG. 2g. The subsequent steps starting from the die attaching step are referred to as the IC packaging steps.

In step 110, the semiconductor die 30 is attached onto the leadframe 20 at the second side, and the semiconductor die 30 is bonded to the plurality of bonding pads 28 through a plurality of bonding wires 32. In an exemplary embodiment, the semiconductor die 30 is disposed on and physically attached to at least one routing lead 25 through an electrically insulating die attach pad (not shown). The semiconductor die 30 is electrically connected to the routing leads 25 through the bonding wires 32 and the bonding pads 28 where the bonding pads 28 are not disposed directly under the semiconductor die 30. The routing lead 25 can subsequently be routed directly under the semiconductor die 30 to one of the lands 22. The IC package after step 110 is shown in FIG. 2h.

Figure 2I:
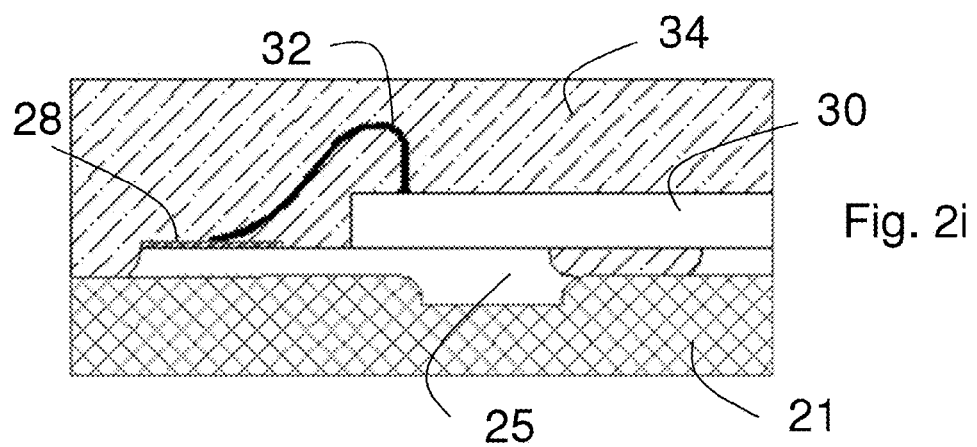

In step 112, the structure in FIG. 2h is encapsulated at the second side of the leadframe 20 with an encapsulation compound 34. The encapsulation compound 34 fills the second recessed portion 27 and covers the plurality of routing leads 25, the plurality of bonding pads 28, the semiconductor die 30 and the bonding wires 32. The second encapsulation compound 34 is in contact with the first bonding compound 21 at areas common to both first recessed portion 24 and second recessed portion 27, as the leadframe material is completely etched away at those areas. The IC package after step 112 is shown in FIG. 2i.

Figure 2J:
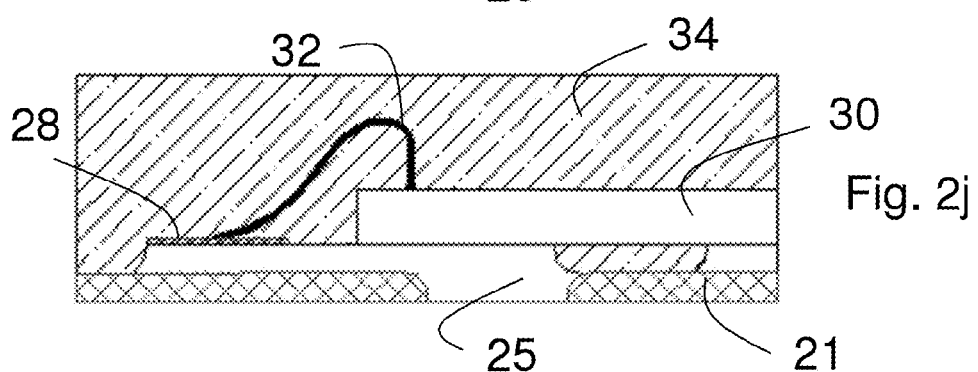
Figure 2K:
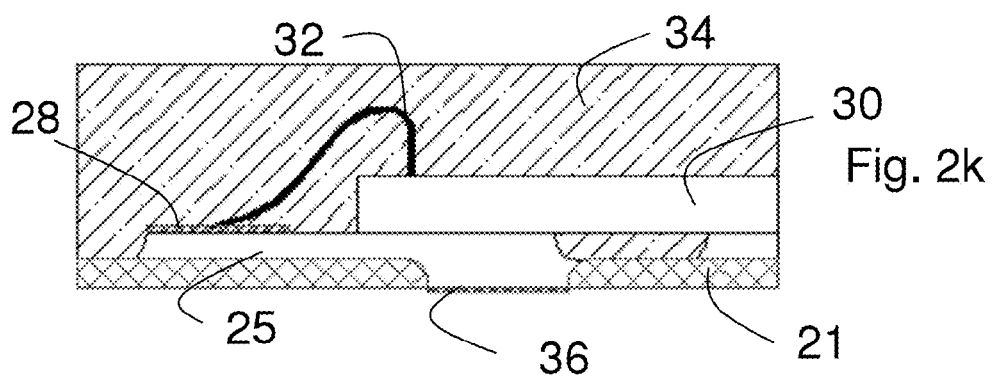

In step 114, the first bonding compound 21 is selectively removed to expose the lands 22 at the first side of the leadframe 20. In a preferred embodiment, the first bonding compound 21 is selectively removed to expose the lands 22 with the remaining first bonding compound 21 being level or coplanar to the lands 22 and filling the first recessed portion 24, i.e. the second portion of the first bonding compound 21 is removed, leaving the first portion attached. Afterwards, solder pads 36 are disposed on each of the lands 22 for attaching to the external device in step 116. The IC package after step 114 and step 116 are shown in FIGS. 2j and 2k respectively.

It is known to one skilled in the art that the above process, and subsequent processes described below, are done at the substrate strip level, and a step of singulation from the substrate strip to produce individual IC packages is performed after step 116. It is also appreciated that other techniques applicable to facilitate the manufacturing process such as aligning the molds to the substrate strip can be used in the embodiments of the present invention.

Figure 3:
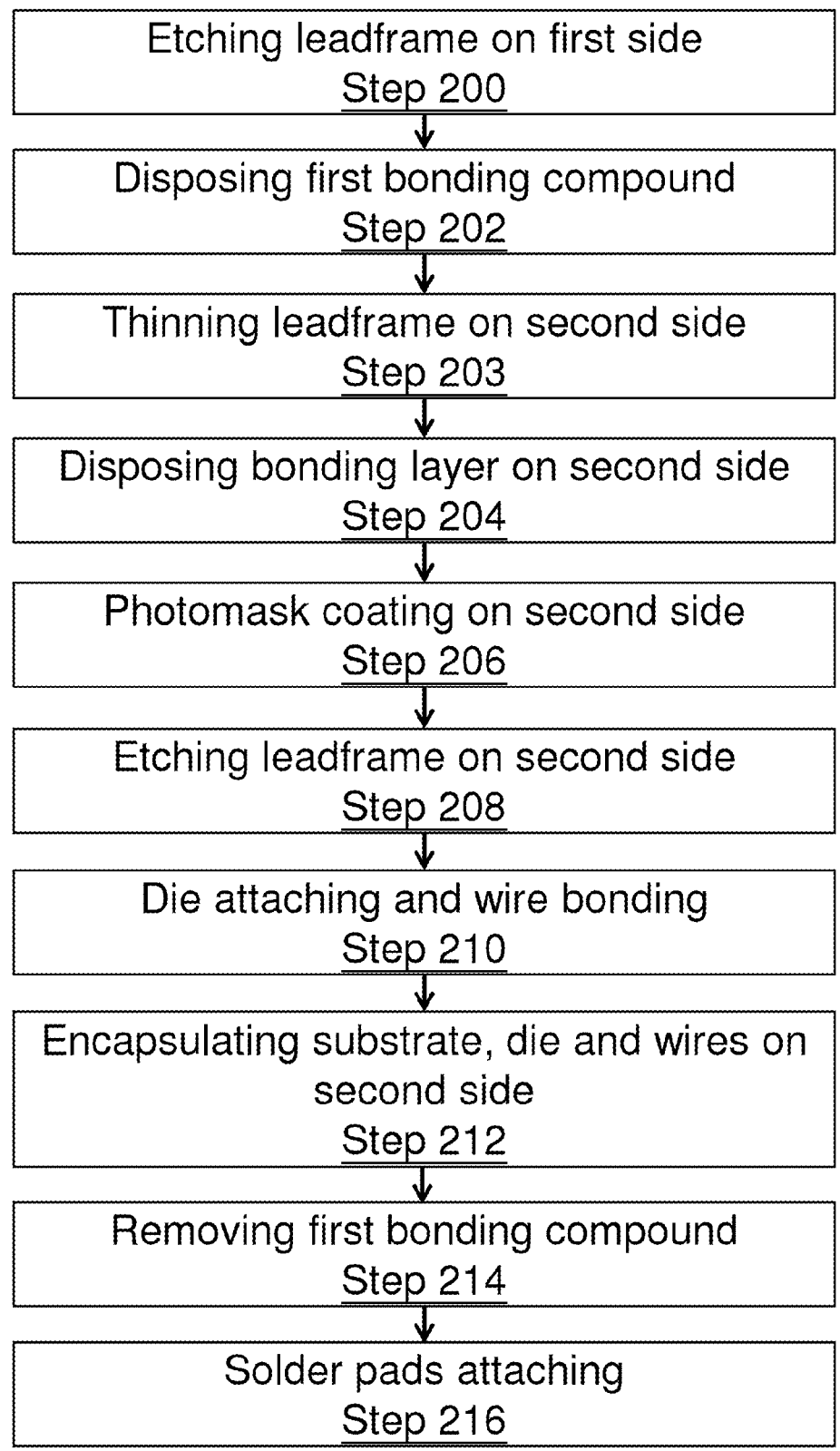
FIG. 3 is a flow chart of a process of manufacturing an integrated circuit chip package according to another embodiment of the present invention.
Figure 4A:
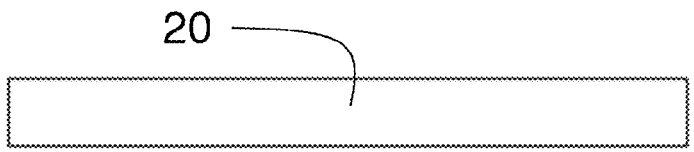
FIG. 4a-4k is a cross-sectional view of an integrated circuit chip package at different steps of the process of FIG. 3.
Figure 4B:
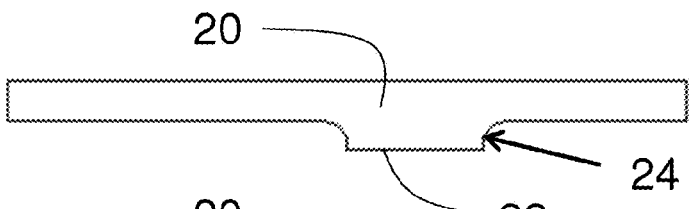
Figure 4C:
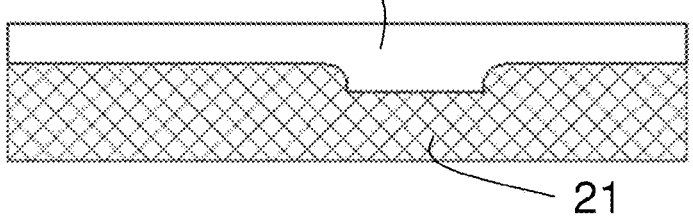
Figure 4D:
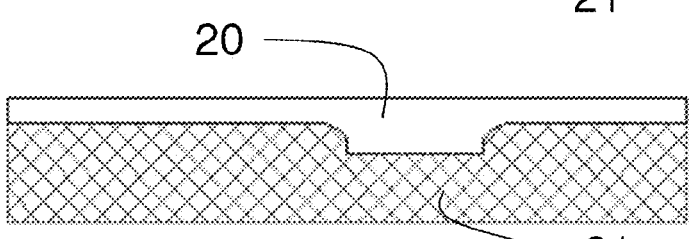
Figure 4E:
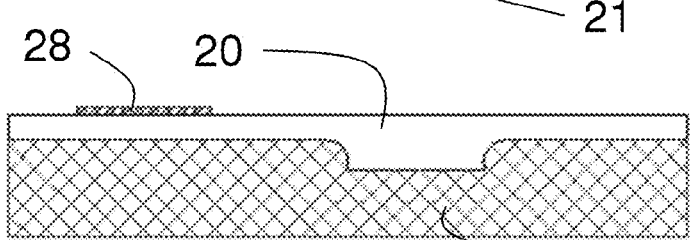
Figure 4F:
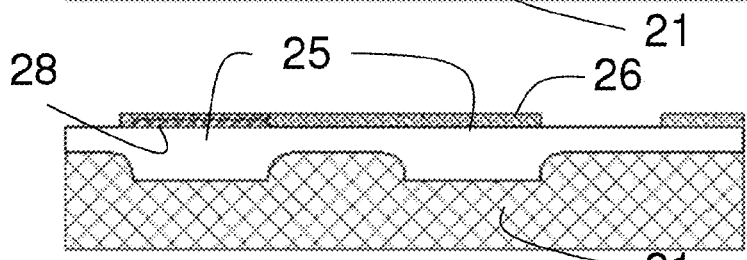
Figure 4G:
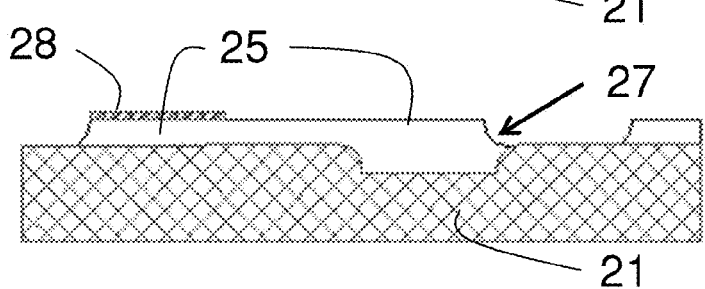
Figure 4H:
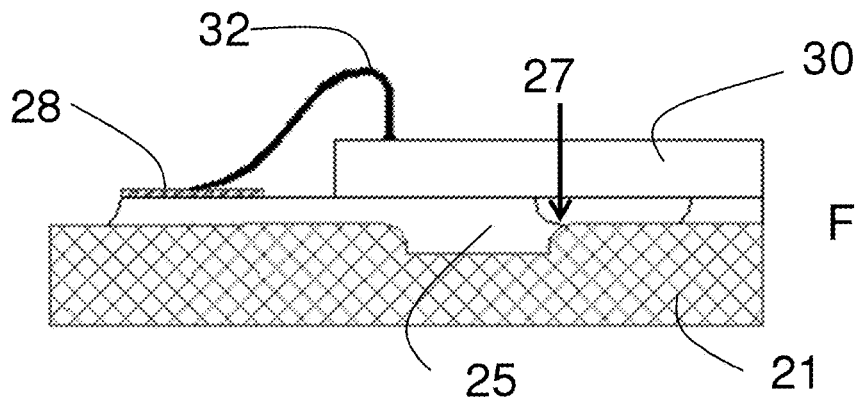
Figure 4I:
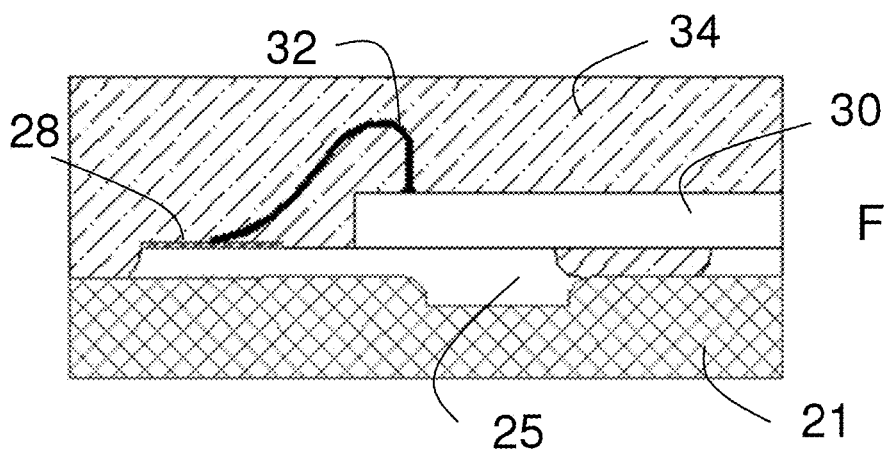
Figure 4J:
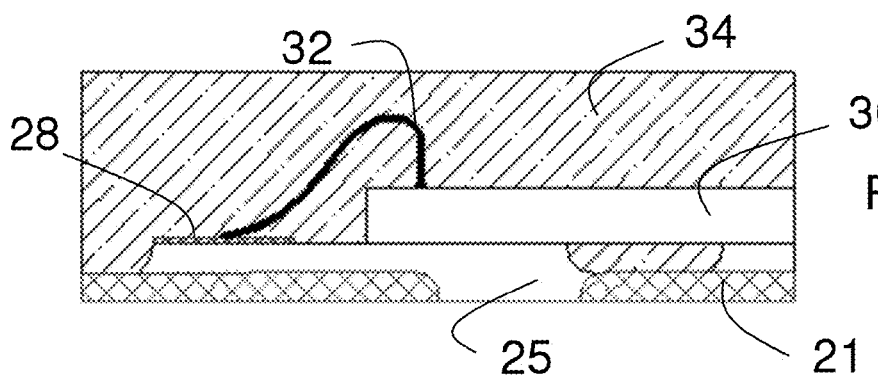
Figure 4K:
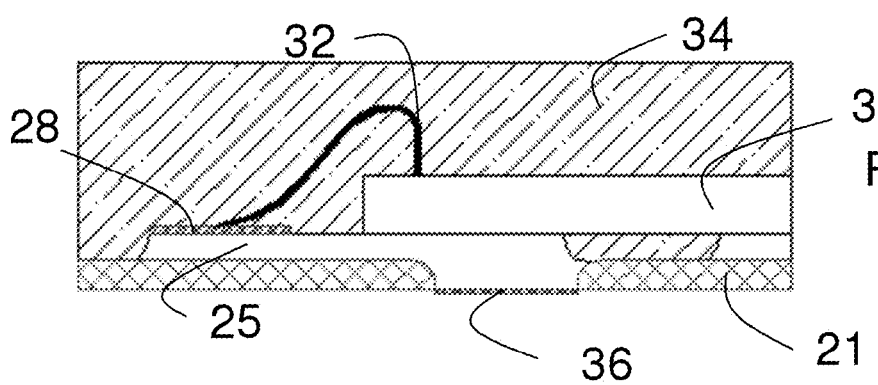
Figure 5:
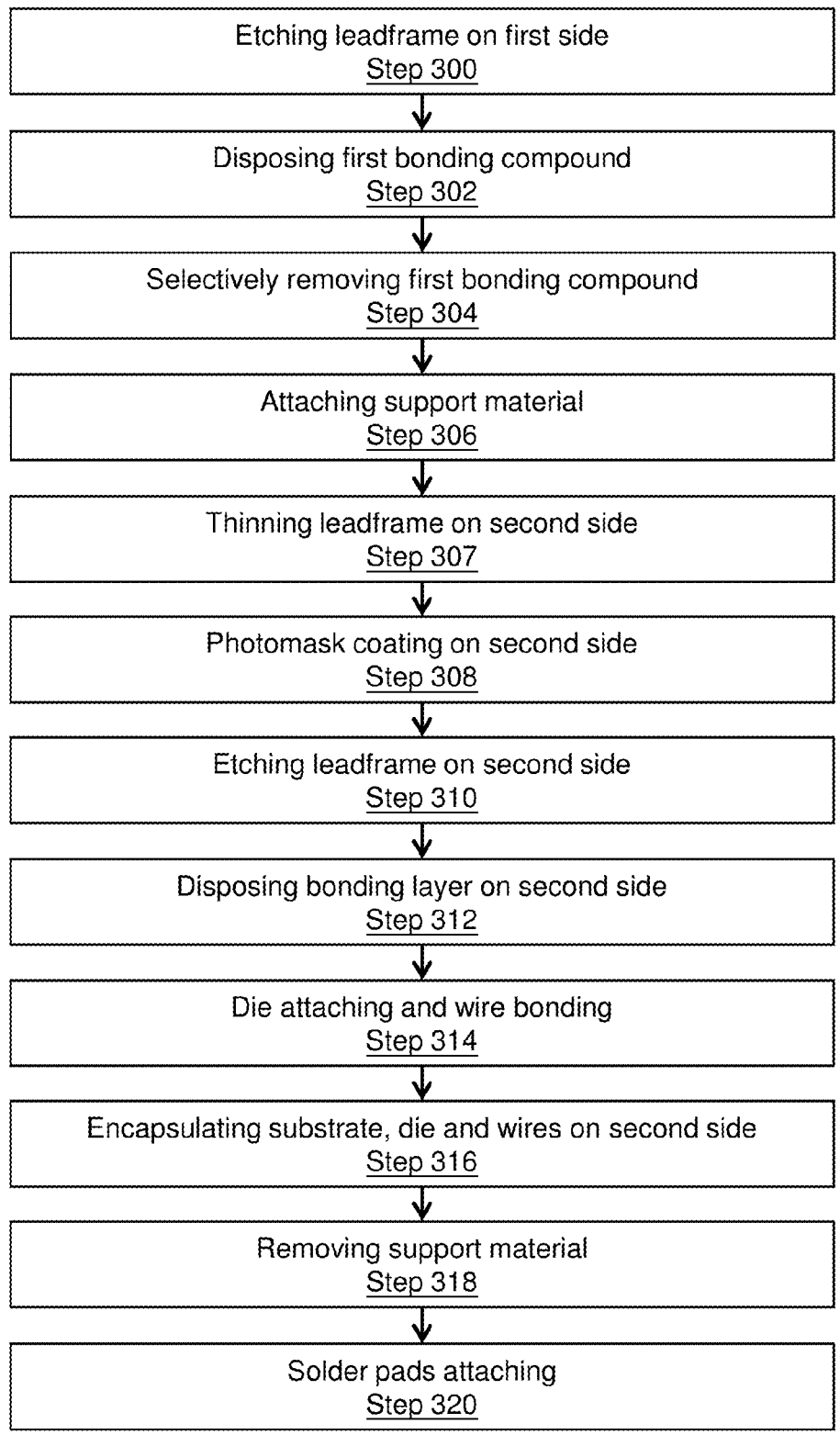
FIG. 5 is a flow chart of a process of manufacturing an integrated circuit chip package according to another embodiment of the present invention.

In a second embodiment of the present invention as shown in FIGS. 3 and 4a-4k, the leadframe 20 is first etched at the first side (step 200), then the first bonding compound 21 is disposed on the first side (step 202), and the optional thinning step is performed (step 203). In this embodiment, the bonding layer is then disposed (step 204) before coating the photomask 26 (step 206) and etching the leadframe on the second side to reveal the routing leads 25 (step 208). That means the bonding layer is first disposed on the leadframe 20 at the second side, then the photomask 26 is disposed on the leadframe 20 at the second side, covering the routing leads 25 as well as the bonding pads 28, as shown in FIG. 4f. The semiconductor die 30 is then attached with wire bonding (step 210), the encapsulation compound 34 is disposed (step 212), the first bonding compound 21 is selectively removed from the first side (step 214), and solder pads 36 are disposed on the lands 22 (step 216). The substrate or IC package at different steps of the process is shown in FIGS. 4a-4k.

As the first encapsulation compound 21 of the pre-bonding step provides the power to hold the leadframe 20 together, when additional first encapsulation compound 21 is disposed to cover the entire leadframe 20, the depth of the first recessed portion 24 can be further reduced. That means a thinner lead frame can be used and as such results in reduced lead frame material usage and also reduced thickness of the final IC package. In a specific embodiment, in a leadframe 20 of 5.0 mil thickness, the depth of the first recessed portion 24 is 2.5 mil. It follows that the second recessed portion 27 also is 2.5 mil thick.

The thickness of the first bonding compound 21 used in the above embodiment is dependent on the thickness of the leadframe 20 and the depth of the first recessed portion. In an exemplary embodiment, where the first recessed portion 24 is 2.5 mil deep, the thickness of the first bonding compound 21 is around 1-5 mil over the first recessed portion 24, such that enough holding strength can be provided to hold the leadframe 20 together.

In another exemplary embodiment where the leadframe 20 is 20 mil thick and the first recessed portion 24 is 10 mil deep, the first bonding compound 21 only fills the first recessed portion 24 and does not extend over the lands 22. In other words, the first bonding compound 21 only comprises the first portion and without the second portion. One of the reasons is that the first bonding compound 21 having a thickness of 10 mil is already able to provide the required strength to hold the leadframe 20 together, therefore additional thickness over the leadframe 20 is not necessary. However, a step to grind and/or polish to the contact areas will be required based on the amount of bonding compound 21 that covers the contacts during this process.

By using bonding wires 32 to electrically connect the semiconductor die 30 to the routing leads 25, the bonding sites of the routing leads 25 does not need to be limited to be directly under the semiconductor die 30. In one exemplary embodiment, a lateral extent of the plurality of bonding pads 28 is larger than the size of the semiconductor die 30. That means a larger area is able to be used for bonding to the semiconductor die 30, without making the routing directly under or near the semiconductor die 30 overcrowded. This is especially effective when many lands 22 are needed for the semiconductor die 30.

In one embodiment, the bonding pads 28 are located as close to the semiconductor die 30 as the technology allows. This minimizes the wire lengths in the IC package and thus optimizes the yield and performance of the IC package while minimizes wire material usage and also the size of the entire IC package. In one embodiment, at least one routing lead 25 runs between two adjacent bonding pads 28 in a routing pattern of routing leads 25.

In an exemplary embodiment, the first encapsulation compound 21 has a coefficient of thermal expansion (CTE) between the CTE of a conventional semiconductor die (around 2.8-3.2) and the CTE of a conventional printed circuit board (around 23). This choice of CTE is essential to the ability of the IC package to operate at high temperatures, as explained below.

Figure 14A:
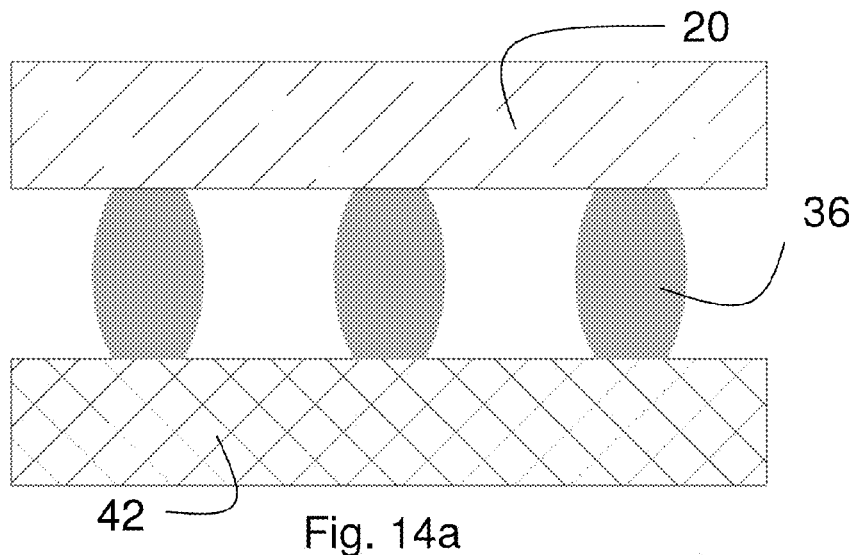
FIG. 14a is a side view of an IC package bonded to a printed circuit board at room temperature.
Figure 14B:
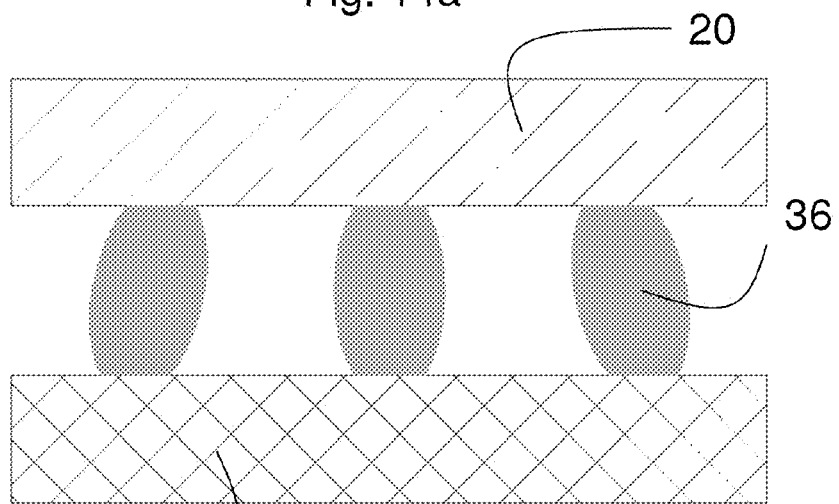
FIG. 14b is a side view of the IC package in FIG. 14a in high temperature where the CTE of the IC package is lower than that of the printed circuit board.
Figure 14C:
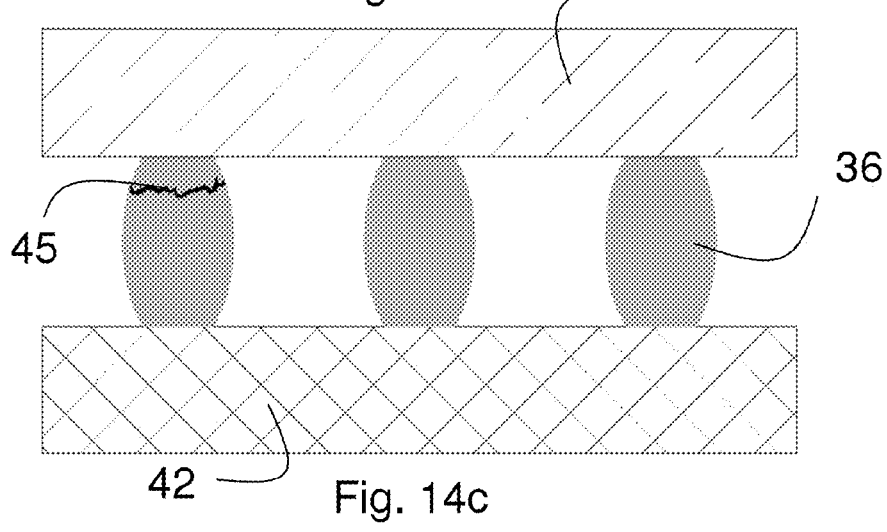
FIG. 14c shows a solder crack between the IC package and the printed circuit board.

Referring to FIG. 14a, when the IC package is bonded to the printed circuit board at room temperature, the solder pads 36 of the IC package is aligned to the corresponding ports of the printed circuit board. When the printed circuit board and the IC package are operating at a high temperature, as shown in FIG. 14b, both the printed circuit board and the IC package will expand, but at different rates as mentioned above. As such, the expansion creates a stress force on the solder joints between the IC package and the printed circuit board and at the lands 22 of the IC package. When the stress force is too large, the solder joints will break, making the entire product that uses the IC package unusable. Even the solder joint may be able to withstand such stress force without breaking, after a number of cycles between high temperature and low temperature the solder joint will start to fatigue and may break at the same stress force as time passes by, as illustrated by a solder crack 45 in FIG. 14*c*. Therefore, the CTE of the first bonding compound 21 needs to be carefully chosen to ensure the stress force is spread around between the first bonding compound 21 and the solder joints for optimal performance.

In one embodiment, the first bonding compound 21 is also an encapsulation compound. In one embodiment, the first bonding compound 21 has a CTE between 7-15. In an exemplary embodiment, the first bonding compound 21 is an engineered plastic material e.g. epoxy or other thermoset or thermoplastic compound having a CTE of around 12 (e.g. 11-13).

In one embodiment, the CTE of the first bonding compound 21 is dependent on the thickness of the leadframe 20. In general, the CTE of the first bonding compound is more towards the high end when the leadframe 20 is thinner and vice versa.

In one embodiment, the selective removing of the first bonding compound 21 (step 114) is performed by a user of the IC package. That means the IC package is transported with the first bonding compound 21 still covering the lands 22. In an exemplary embodiment, the substrate is transported to the user right before the die attachment and wire bonding step.

In an exemplary embodiment, the first bonding compound 21 is conveniently mechanically removable by using a polishing machine for example. A user of the IC package mechanically removes the first bonding compound 21 from the IC package to reveal the lands 22 of the IC package before attaching the solder pads 36 and bonding the IC package to the printed circuit board. To completely remove the second portion of the first bonding compound 21 for attachment of solder pads 36 and subsequent bonding to the printed circuit board, the first bonding compound 21 should be 3 mil or less in thickness at the stage of final polish. If the initial thickness of the bonding compound 21 over the leadframe 20 is more than 3 mil, a portion of the first bonding compound 21 will be first polished using a coarser grit material to reduce the thickness to less than 3 mil for the final polishing step.

Figures 6A, 6B, 6C, 6D, 6E, 6F, 6G, 6H:
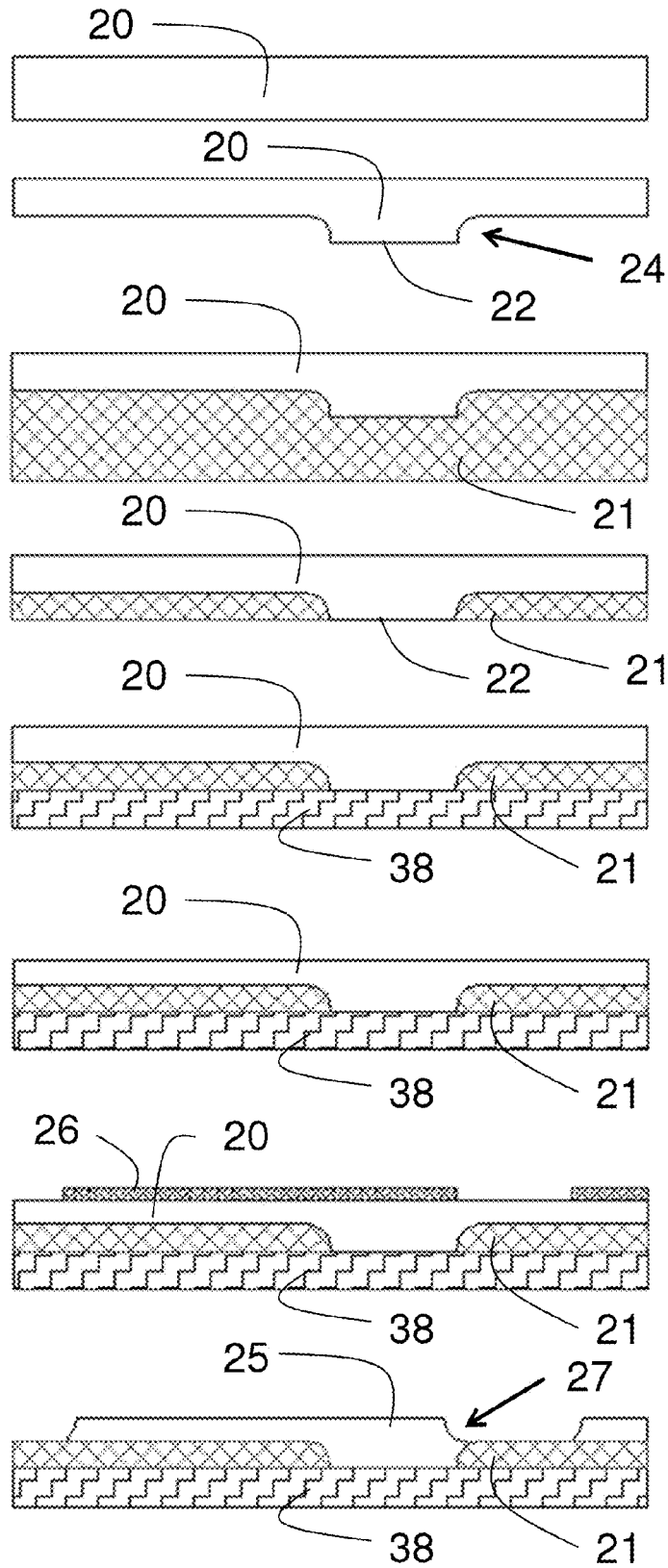
FIG. 6a-6m is a cross-sectional view of an integrated circuit chip package at different steps of the process of FIG. 5.

In another exemplary embodiment of the present invention as shown in FIGS. 5 and 6*a*-6*m*, a support material is used in additional to the first bonding compound 21. The leadframe 20 is still first etched at the first side (step 300, FIG. 6*b*) to define the lands 22 and the first bonding compound 21 is disposed on the first side of the leadframe (step 302, FIG. 6*c*). Afterwards, the first bonding compound 21 is then selectively removed to expose the lands 22 (step 304, FIG. 6*d*), as performed in the previous embodiments after the encapsulation compound is disposed (step 112 or 212). The support material 38 is then attached to the first side of the substrate contacting the lands 22 (step 306, FIG. 6*e*). In one embodiment, the support material 38 is also adhered to the first bonding compound 21 where the first bonding compound 21 is coplanar to the lands 22.

The subsequent steps of the process from the optional thinning step (step 307) onwards until the encapsulation step at the second side of the substrate (step 316) is the same as the process as shown in FIGS. 2*d* to 2*k*, shown in FIGS. 6*f*-6*k*. Instead of selectively removing the first bonding compound 21 in the previous embodiments (steps 114, 214), in this embodiment the entire support material 38 is removed, leaving only the first bonding compound 21 with the lands 22 exposed (step 318, FIG. 6*l*). Solder pads 36 are then disposed on the lands for bonding (step 320, FIG. 6*m*) to finish the IC package.

The use of the support material 38 in this embodiment makes the process, especially the step of selectively removing the first bonding compound 21 easier. This is due to the fact that the IC package before the aforementioned step only has the leadframe 20 and the first bonding compound 21, which is much simpler than that in the previous embodiments with the semiconductor die 30. Depending on the removing process, the semiconductor die 30 or other components such as the encapsulation compound 34 may be damaged during the removing process, thus reducing yield of the product. The support material 38 is attached after selectively removing the first bonding compound 21 to provide the additional strength needed to support the substrate for subsequent manufacturing steps, which is previously provided by the removed portion of the first bonding compound 21.

Using the support material 38 also lowers the requirement for choosing the appropriate material as the first bonding compound 21. The first bonding compound 21 should have a CTE within a specific range, with sufficient strength to hold the leadframe 20 together and also being easy to remove by processes such as mechanical polishing. When the support material 38 is also used, each of these characteristics only needs to be found in one of the materials. In an exemplary embodiment, the first bonding compound 21 is selected for having an appropriate CTE, and the support material 38 is selected for strength and ease of removal. In a specific embodiment, the support material 38 is a high temperature tape currently used in QFN packages. This has an added advantage of the user not needing a separate polishing machine, as users are likely to have such tape removal process ready and operating, thus making the process more convenient for the user.

In an alternative embodiment, the support material 38 is the only material holding the leadframe 20 together, which means that the first bonding compound 21 is absent. The support material 38 would then be only adhered to the lands 22, with the first recessed portion 24 unfilled. Apart from holding the leadframe 20 together, the support material 38 also covers the lands 22 to prevent mold flash during encapsulation of the IC package.

In various embodiments, the steps of selectively removing the first bonding compound 21 and attaching the support material 38 can be done at any time between disposing the first bonding compound 21 and attaching the semiconductor die 30. Preferably, the support material 38 is attached right after selectively removing the first bonding compound 21 to minimize the chance of breaking of the substrate. In another embodiment, the initial disposal of the first bonding compound 21 only fills the first recessed portion 24 and does not extend over the leadframe 20, thus the selective removal is not needed and the support material 38 can be directly attached thereto.

In another embodiment of the present invention as shown in FIGS. 7 and 8*a*-8*k*, the steps are the same as the embodiment as shown in FIG. 3 until the routing leads 25 are defined, i.e. steps 400-408 are the same as steps 200-208 (shown in FIGS. 8*a*-8*g*). In this embodiment however, after etching the leadframe on the second side, the first bonding compound 21 is selectively removed (step 410, FIG. 8*h*), similar to step 318 of the above embodiment. Also, in this embodiment, solder pads 36 are disposed onto the lands 22 (step 412, FIG. 8*i*) before attaching the support material 38 to the first side of the substrate (step 414, FIG. 8*j*). The IC package is then finished with die attaching with wire bonding, disposing the encapsulation compound 34 and removing the support material 38 (steps 416-420, FIG. 8*k*-8*m*).

Having the solder pads 36 disposed on the lands 22 before attaching the second support material 38 further makes the IC package more convenient to use, as the user can now simply remove the support material 38 and the IC package is ready for bonding to the printed circuit board. That means the user does not need to dispose solder pads 36 on his end.

Figure 10A:
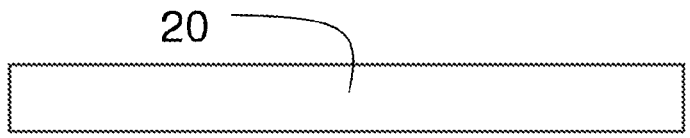
FIG. 10a-10l is a cross-sectional view of an integrated circuit chip package at different steps of the process of FIG. 9.
Figure 10B:
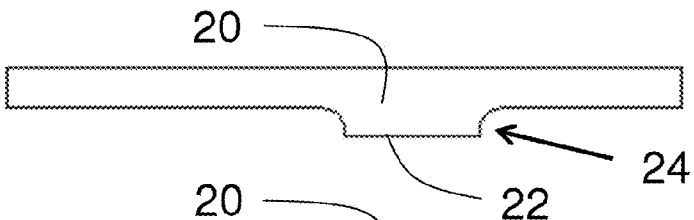
Figure 10C:
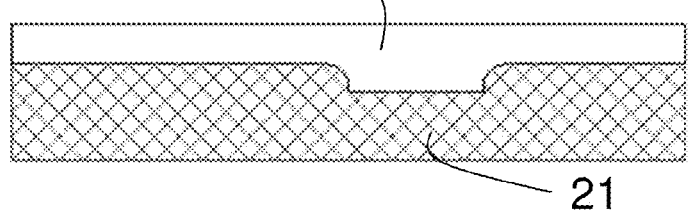
Figure 10D:
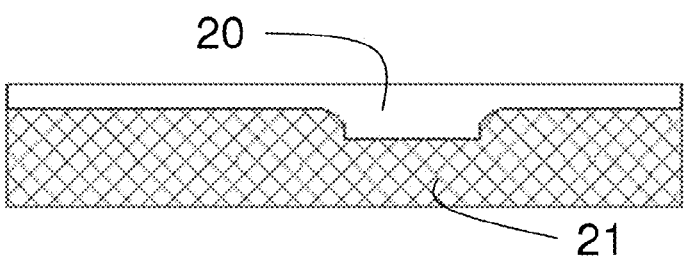
Figure 10E:
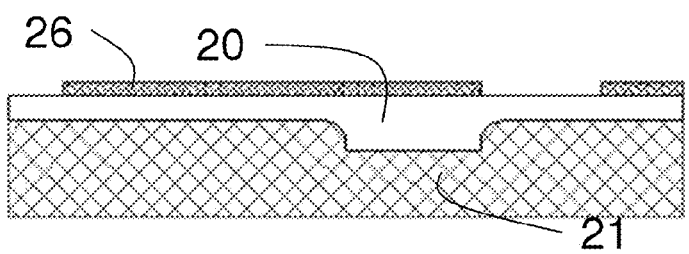
Figure 10F:
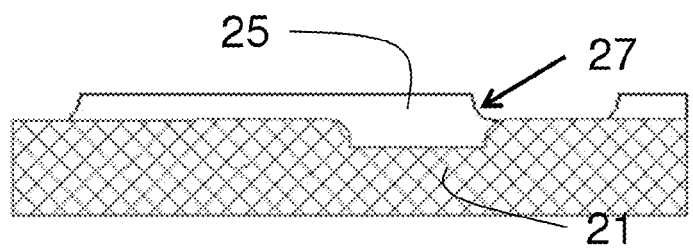
Figure 10G:
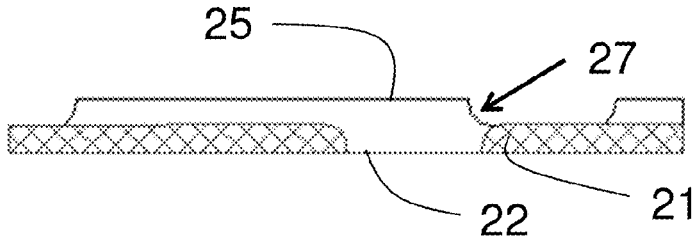
Figure 10H:
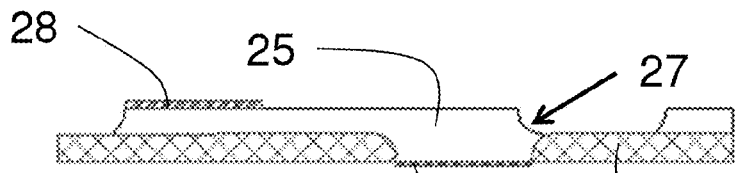
Figure 10I:
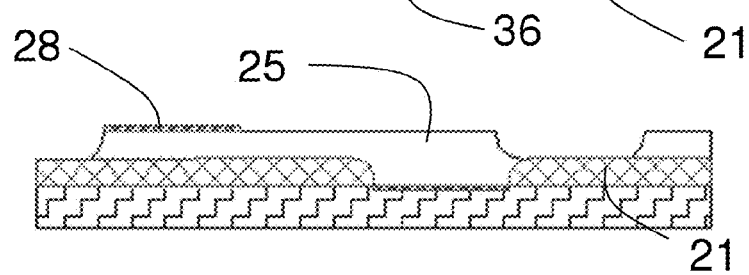
Figure 10J:
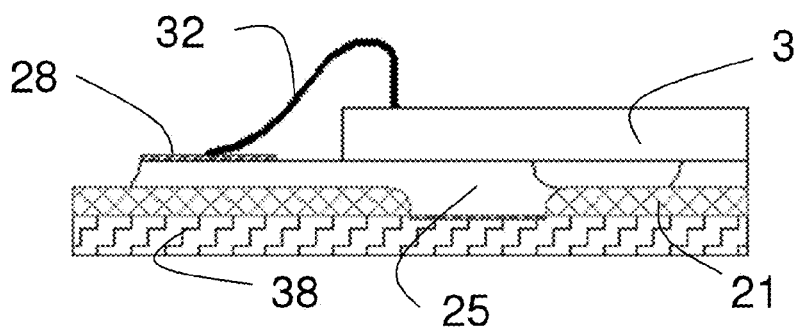
Figure 10K:
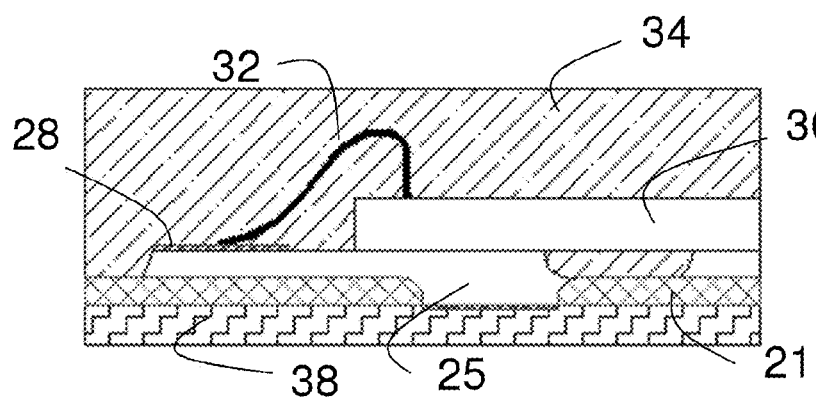
Figure 10L:
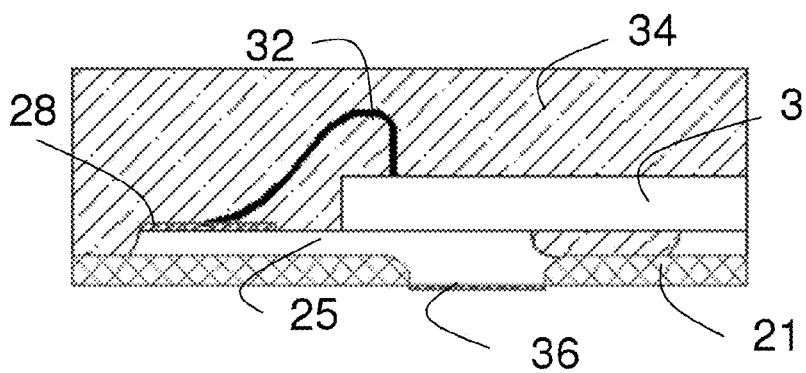
Figure 11:
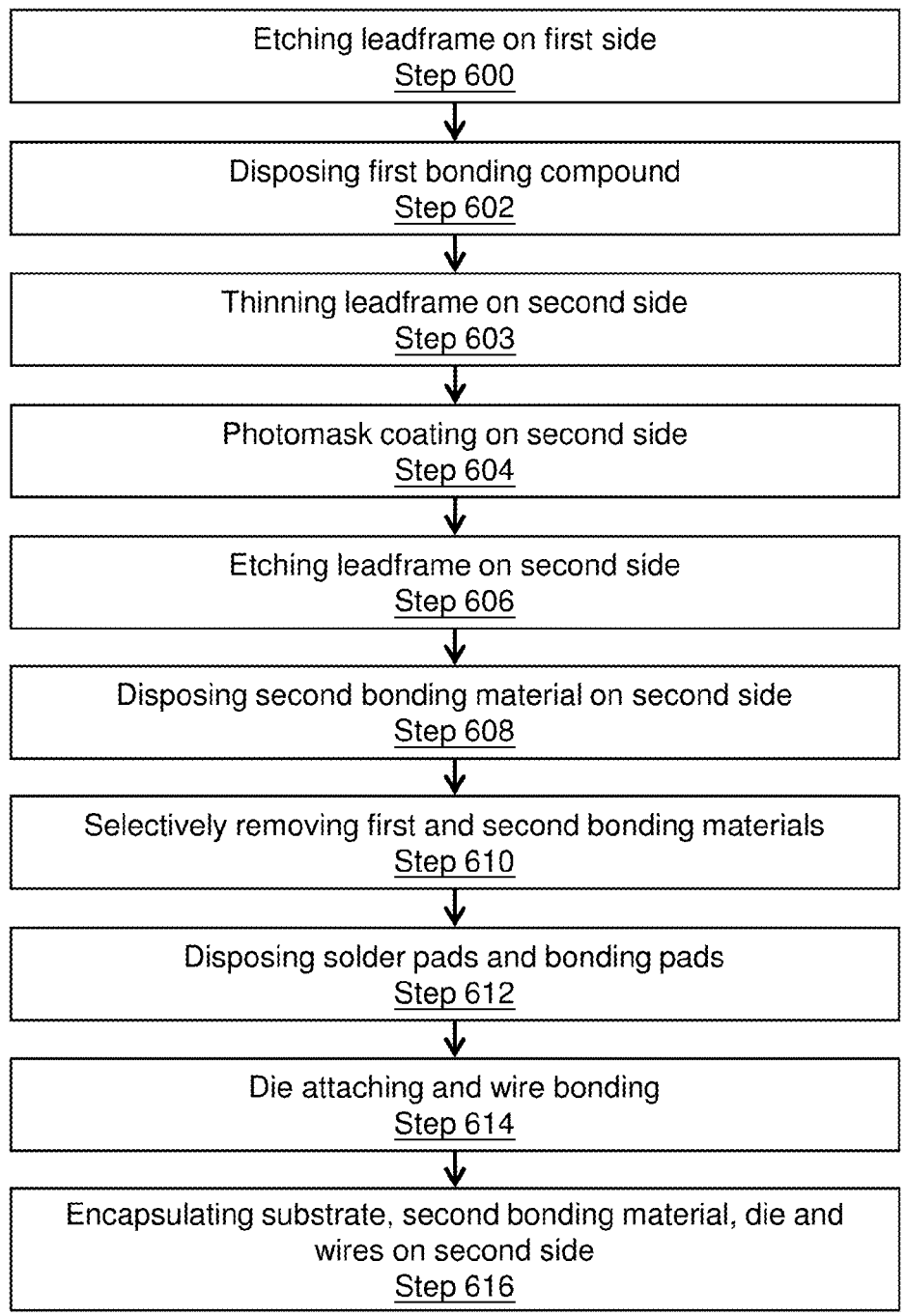
FIG. 11 is a flow chart of a process of manufacturing an integrated circuit chip package according to another embodiment of the present invention.

In another embodiment as shown in FIGS. 9 and 10a-10k, the leadframe 20 is first etched on the first side (step 500, FIG. 10b), then the first bonding compound 21 is disposed (step 502, FIG. 10c) and the optional thinning is performed (step 503, FIG. 10d). Afterwards, the photomask 26 is coated on the second side of the substrate (step 504, FIG. 10e). After coating the photomask, the substrate is etched at the second side to define routing leads 25 (step 506, FIG. 10f), and then the first bonding compound 21 is selectively removed to expose the lands 22 (step 508, FIG. 10g). As shown in FIG. 10g, at this stage the lands 22 and the routing leads 25 are both exposed. Afterwards, the deposition of bonding pads 28 and the solder pads 36 at the routing leads 25 and the lands 22 respectively is performed in a single step (step 510, FIG. 10h). The support material 38 is then disposed (step 512, FIG. 10i) for subsequent die attaching (step 514, FIG. 10j) and encapsulating on second side (step 516, FIG. 10k). The support material 38 is then removed to finish the IC package (step 518, FIG. 10l).

By using a single step to deposit the bonding layer 28 and the solder pads 36, the total number of steps in manufacturing can be reduced, thus simplifying and optimizing the process.

In yet another exemplary embodiment as shown in FIGS. 11 and 12a-12j, first the routing leads 25 are defined in a way identical to steps 500-506 in the above embodiment (steps 600-606, FIGS. 12b-12f). Afterwards, a second bonding compound 40 is disposed on the second side of the substrate (step 608, FIG. 12g), covering the routing leads 25 and the second recessed portion 27, and also contacting the first bonding compound 21 from the second recessed portion 27. In one embodiment, the second bonding compound 40 extends over the second side of the-substrate by a predetermined distance, similar to the way the first bonding compound 21 extending over the first side of the leadframe 20. Afterwards, the first bonding compound 21 and the second bonding compound 40 are both selectively removed to be coplanar to the lands 22 and the routing leads 25 respectively (step 610, FIG. 12h). Bonding pads 28 and solder pads 36 are then simultaneously deposited on the routing leads 25 and the lands 22 respectively (step 612, FIG. 12i). The semiconductor die 30 is then attached to the second side of the-substrate 20 with bonding wires 32 (step 614, FIG. 12j), and the encapsulation compound 34 is then disposed to cover the semiconductor die 30, the bonding wires 32, the bonding pads 28 and also the second bonding compound 40 to finish the IC package (step 616, FIG. 12k).

This embodiment uses the second bonding compound 40 to fill the second recessed portion 27 in addition to using the first bonding compound 21 to fill the first recessed portion 24 for holding the leadframe 20 together. Therefore this second bonding compound 40 provides extra holding strength to the substrate during the subsequent steps to finish the substrate and IC package (steps 610 to 616, FIGS. 12i through 12k), thus further reducing the chance of the routing leads 25 being displaced during these steps.

In one embodiment, the support material 38 as shown in FIG. 6 is also attached to the substrate, especially useful in the case where the leadframe 20 is very thin.

In one embodiment, the first bonding compound 21 is the same as the second bonding compound 40. In another embodiment, the second bonding compound 40 is chosen to be different. One reason would be the need for a different CTE requirement than the first bonding compound 21, such as between the CTE of the semiconductor die 30 and the first bonding compound 21, due to that the second bonding compound 40 is closer to the semiconductor die 30.

In one embodiment, instead of using a die attach pad for electrically insulating the routing leads 25 from the semiconductor die 30, a non-conductive die attach material is selectively disposed onto a predetermined area of the second side of the substrate 20. In an exemplary embodiment, the predetermined area is the area where the semiconductor die will be attached to the substrate. In one embodiment, the die attach material is disposed onto the routing leads 25 within the predetermined area. As such, the area having the die attach material is similar to the area of the semiconductor die 30.

Figure 15A:
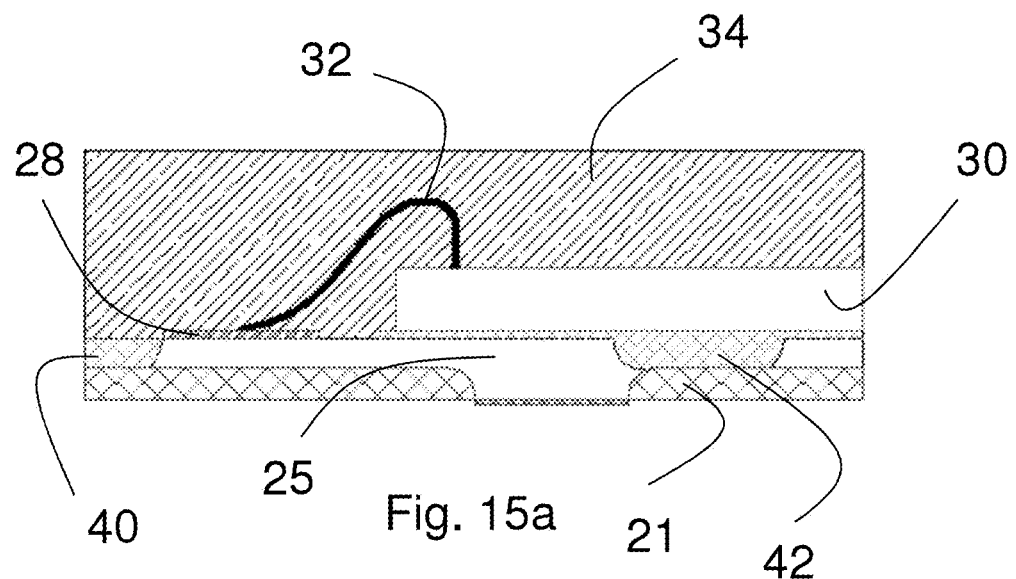
FIG. 15a is a cross-sectional view of an IC package showing a die attach material filling the second recessed portion and attaching to the semiconductor die, according to an embodiment of the present invention.
Figure 15B:
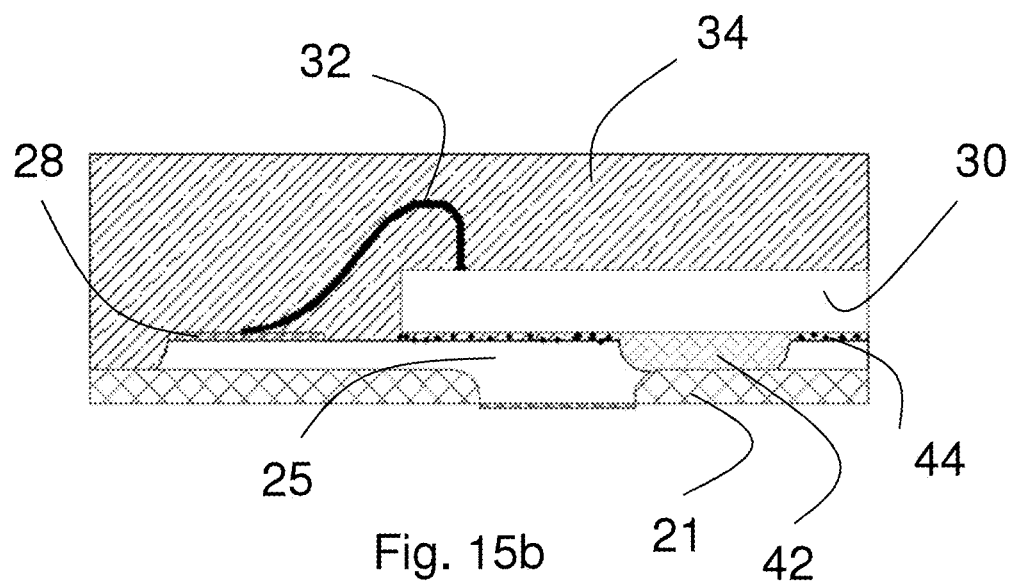
FIG. 15b is a cross-sectional view of an IC package showing separate die attach materials filling the second recessed portion and attaching to the semiconductor die, according to an embodiment of the present invention.
Figure 16:
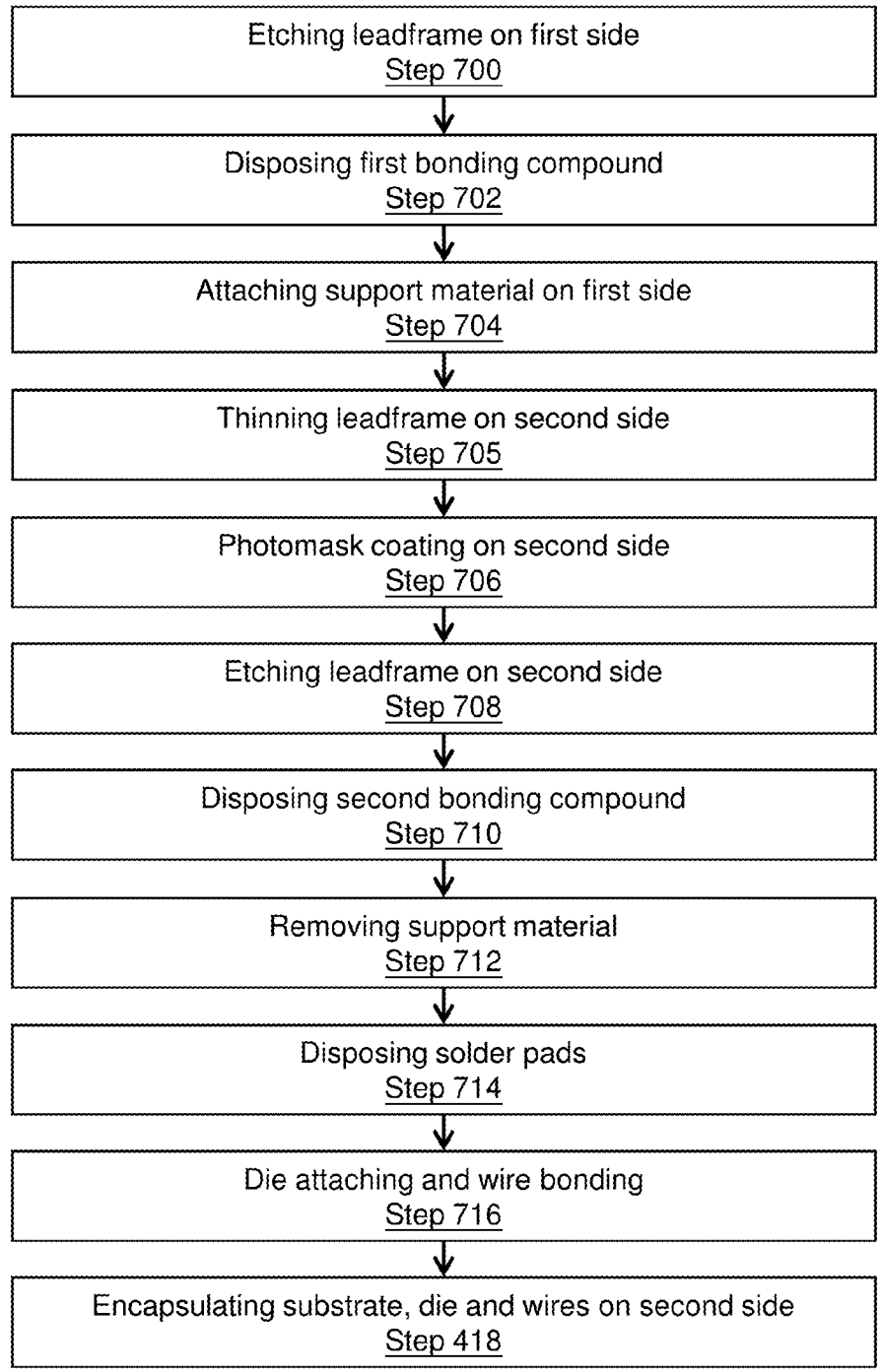
FIG. 16 is a flow chart of a process of manufacturing an integrated circuit chip package according to another embodiment of the present invention.

In an exemplary embodiment as shown in FIG. 15a, the die attach material 42 is disposed onto a predetermined area of the substrate, covering the second recessed portion 27 within this predetermined area, and also covers the routing leads 25 within this predetermined area by a thickness enough for insulating purposes. In another embodiment as shown in FIG. 15b, the material filling the second recessed portion 27 and the material disposed on the routing leads 25 are different. For example, a first die attach material 42 disposed on the routing leads 25 is more thermo-conductive than a second die attach material 44 filling the second recessed portion 27, to improve heat dissipation performance of the semiconductor die 30.

This disposal of the die attach material in the second recessed portion 27 improves the quality of encapsulation of the IC package. In the previous embodiment, a plurality of tunnels defined by the semiconductor die 30 and the second recessed portion 27 will be formed after the semiconductor die 30 is attached onto the leadframe 20 at the predetermined area. Depending on the technology and the encapsulation compound 34 used, these tunnels may not be able to be completely filled with the encapsulation compound 34 during the encapsulation step. That means that air bubbles will be formed within the IC package, and it will greatly hamper the performance of the IC package such as the die delaminating from the surface or poorer transmission of heat out of the package. Disposing the die attach material to fill the second recessed portion 27 before attaching the semiconductor die 30 eliminates such problem.

The step of disposing the non-conductive die attach material can be performed at any time after the substrate is patterned on the second side and before the semiconductor die 30 is attached. In the embodiment shown in FIGS. 1, 3, 5, 7 and 9 the die attach material can be disposed any time after the etching on the second side.

In one embodiment, the non-conductive die attach material is a standard die attach material used in the industry. In an exemplary embodiment, the CTE of the die attach material is designed to be close to that of the semiconductor die 30 as the die attach material is directly beneath the semiconductor die 30. It is especially advantageous in the case where the die attach material is disposed in the second recessed portion 27 also as the area and thickness of the die attach material both increase.

Figure 17H:
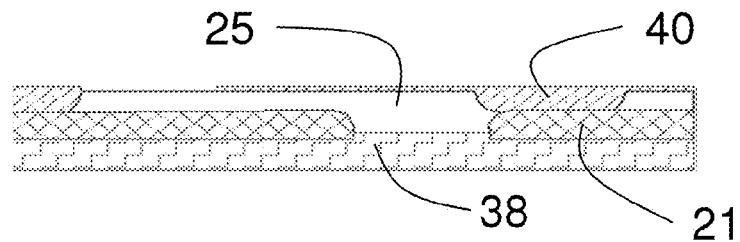

In yet another exemplary embodiment as shown in FIGS. 16 and 17a-h, the leadframe 20 is first etched on the first side (step 700, FIG. 17b), and the first bonding compound 21 is disposed on the first side of the leadframe 20 (step 702, FIG. 17c). In a specific embodiment, the first bonding compound 21 is a photolithographic solder mask. The solder mask is then exposed at selected portions to reveal the lands 22 on the first side of the leadframe 20. In a specific embodiment, the thickness of the solder mask is less than the depth of the first recessed portion 24, so the leadframe 20 does not need to be polished to make the solder mask coplanar with the lands 22. In another embodiment, the first bonding compound 21 is an epoxy material.

An optional support material 38 is then attached to the leadframe 20 at the first side, contacting the first bonding compound 21 and the lands 22 (step 704, FIG. 17d). The leadframe 20 is then optionally thinned at the second side (step 705, FIG. 17e). The photomask 26 is then disposed on the second side of the leadframe 20 (step 706, FIG. 17f). The leadframe 20 is etched on the second side subsequently and the photomask 26 is then removed (step 708, FIG. 17g).

Figure 17I:
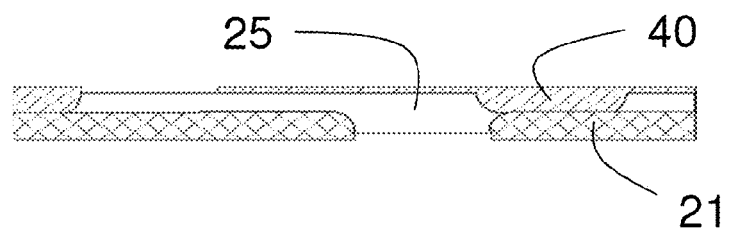
Figure 17J:
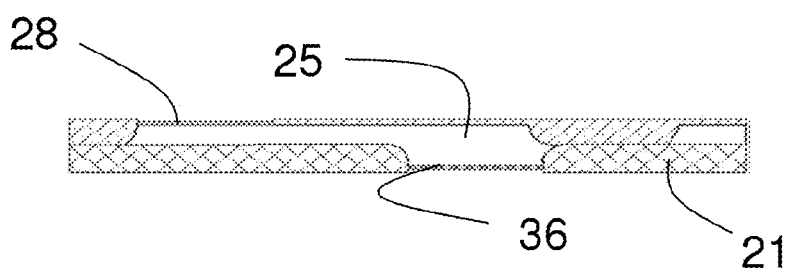
Figure 17K:
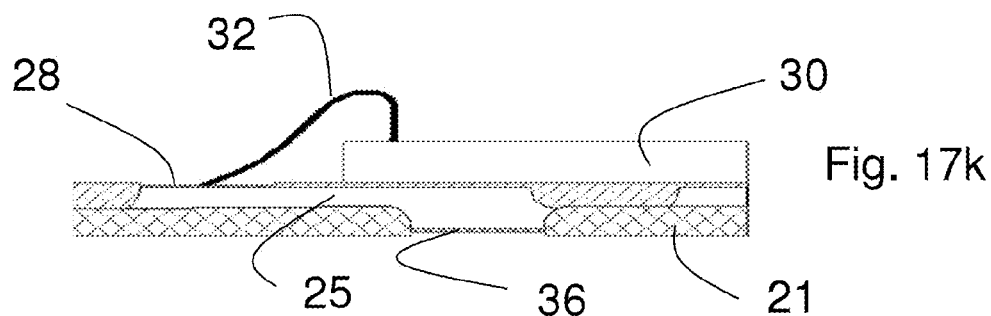
Figure 17L:
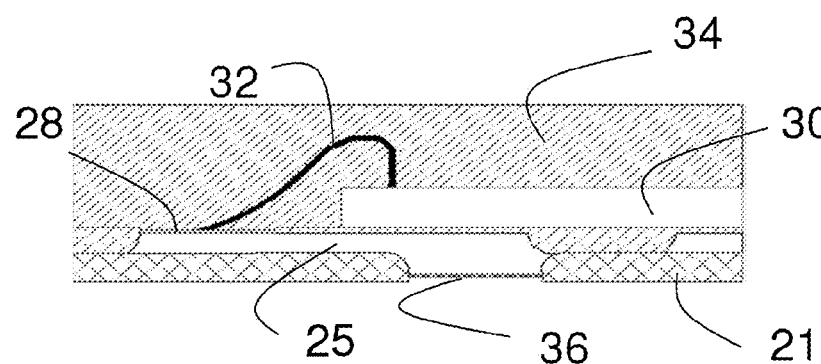

Afterwards, the second bonding compound 40 is disposed on the second side of the leadframe 20 (step 710, FIG. 17h). In an exemplary embodiment, the second bonding compound 40 is a photolithographic solder mask. The solder mask is then exposed at selected portions to reveal the bonding pads 28 on the second side of the leadframe 20. The support material 38 is then removed from the leadframe 20 (step 712, FIG. 17i), the solder pads 36 and bonding pads 28 are disposed attached to the lands 22 (step 714, FIG. 17j), the semiconductor die 30 and the bonding wires 32 are attached (step 716, FIG. 17k), and the encapsulation compound 34 is then disposed to cover the semiconductor die 30, the bonding wires 32, the bonding pads 28 and also the second bonding compound 40 to finish the IC package (step 718, FIG. 17l).

Figure 18A:
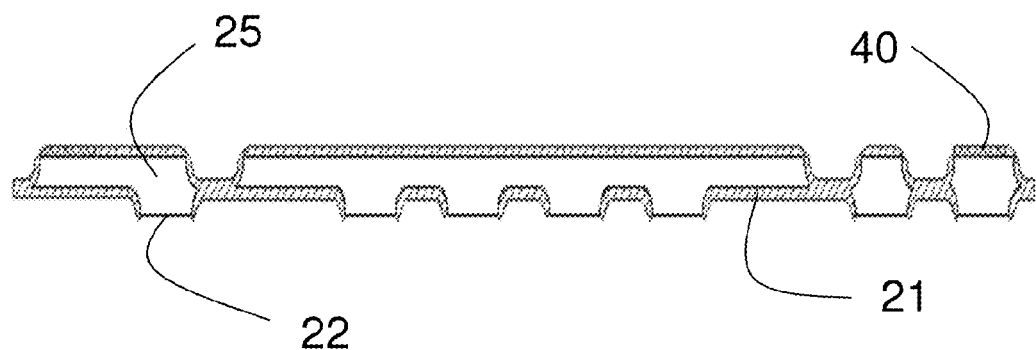
FIG. 18a is a cross-sectional view of a substrate using a photolithographic solder mask as both the first bonding compound and the second bonding compound, according to an embodiment of the present invention.

Using a photolithographic solder mask as the first bonding compound 21 and/or the second bonding compound 40 allows the manufacturer to selectively expose a portion of the leadframe 20 while still covering the other parts of the leadframe 20. For example, in the embodiment as shown above, only the bonding sites of the routing leads 25 are exposed while the rest of the routing leads 25 are still covered by the solder mask. In one embodiment, where the first bonding compound 21 is the solder mask, the solder mask can be thinner than the depth of the first recessed portion 24, and the lands 22 have a clearance to the surface of the solder mask. A cross-section diagram of an example substrate using a solder mask as both the first bonding compound 21 and the second bonding compound 40 is shown on FIG. 18a.

Figure 18B:
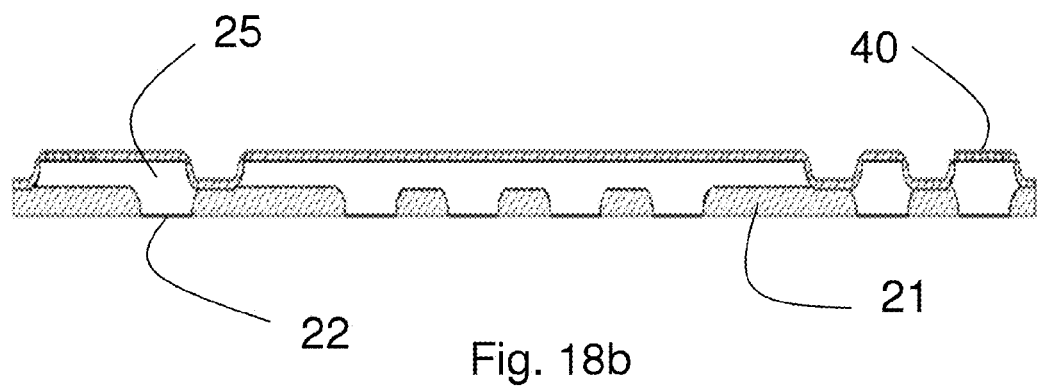
FIG. 18b is a cross-sectional view of a substrate using a photolithographic solder mask as the first bonding compound and an epoxy material as the second bonding compound, according to an embodiment of the present invention.

On the other hand, while an epoxy material is generally stronger, a grinding process is needed to remove the epoxy material from the substrate. The result is that the epoxy material must be coplanar to the exposed portions of the leadframe 20, whether it is the lands 22 or the routing leads 25. A cross-section diagram of an example substrate using an epoxy material as the first bonding compound 21 and a solder mask as the second bonding compound 40 is shown on FIG. 18b. One of the benefits of using epoxy is that the extra strength provided by the epoxy means that the optional support material 38 is generally not required.

Figure 19A:
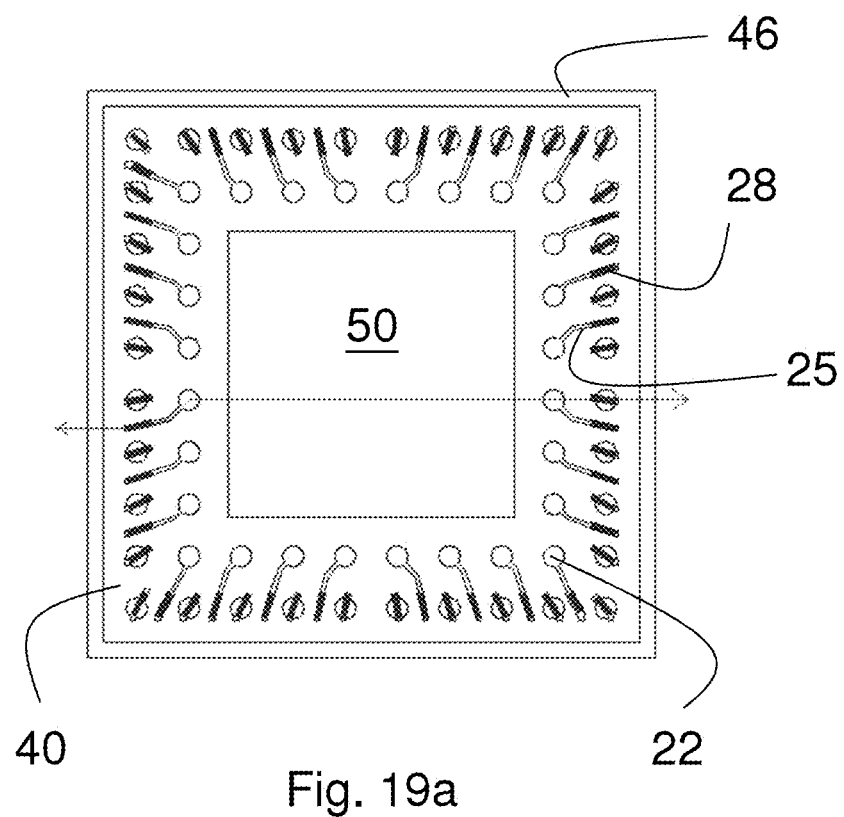
FIG. 19a is a top view of a substrate showing a support ring provided surrounding the substrate, according to an embodiment of the present invention.
Figure 19B:
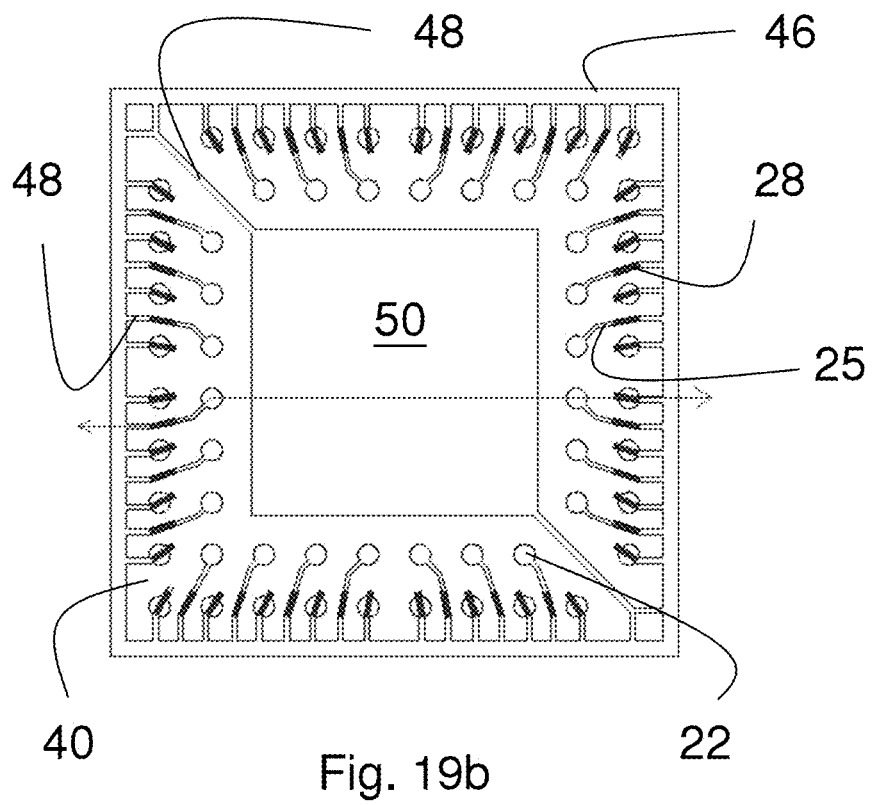
FIG. 19b is a top view of the substrate in FIG. 19a, with a tie bar connecting each routing lead and the die attach pad to the support ring.

In an exemplary embodiment, extra leadframe material is provided to further strengthen the substrate during the manufacturing process. Referring to FIG. 19a, a support ring 46 is provided surrounding each individual unit of the leadframe 20, i.e. routing leads 25, lands 22 or die attach pad. The first bonding compound 21 and the second bonding material 40 both extends to the support ring 46 during the manufacturing process, such that the periphery of the substrate is less likely to displace or break. In another embodiment, tie bars 48 are attached from the support ring 46 to at least one routing lead 25 and may also be attached to the die attach pad 50. Having tie bars 48 further minimizes the chance that a particular structure becomes loose. Also, standard electroplating techniques can be applied to the substrate as each routing lead 25 is now electrically connected during the manufacturing process. The support ring 46 is removed during singulation, therefore the routing leads 25 are still electrically isolated when in use.

Referring now to FIG. 2i, an IC package manufactured by the process in FIG. 1 comprises an electrically conductive lead frame leadframe 20. The leadframe 20 comprises a plurality of lands 22 on a first side of the leadframe with a first recessed portion 24 between lands 22 and a plurality of routing leads 25 on a second side of the leadframe with a second recessed portion 27 between the routing leads 25. Each land 22 is electrically connected to a corresponding routing lead 25. A bonding pad 28 is disposed on a bonding site of each routing lead.

The IC package also comprises a first bonding compound 21. The first bonding compound 21 comprises a first portion that fills the first recessed portion 24 and a second portion that covers the plurality of lands 22 and the first portion. The IC package comprises a semiconductor die 30 with bonding wires 32 electrically connecting the semiconductor die 30 to the bonding pads 28, and an encapsulation compound 34 filling the second recessed portion 27, and also covering the plurality of routing leads 25, the plurality of bonding pads 28, the semiconductor die 30 and the bonding wires 32. The first bonding compound 21 contacts with the encapsulation compound 34 at areas common to the first recessed portion 24 and the second recessed portion 27.

Figures 6I, 6J, 6K, 6L, 6M:
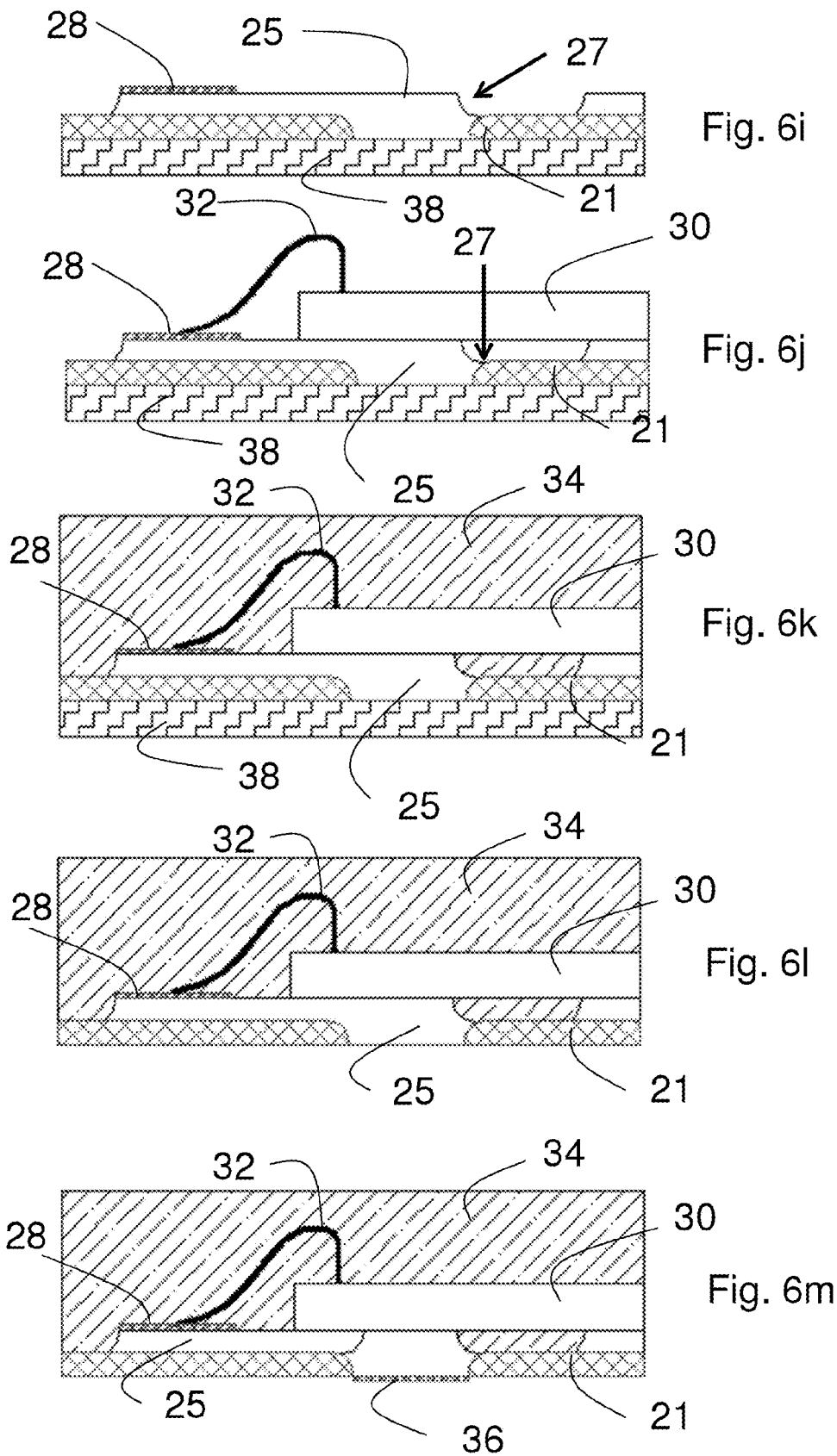
Figure 7:
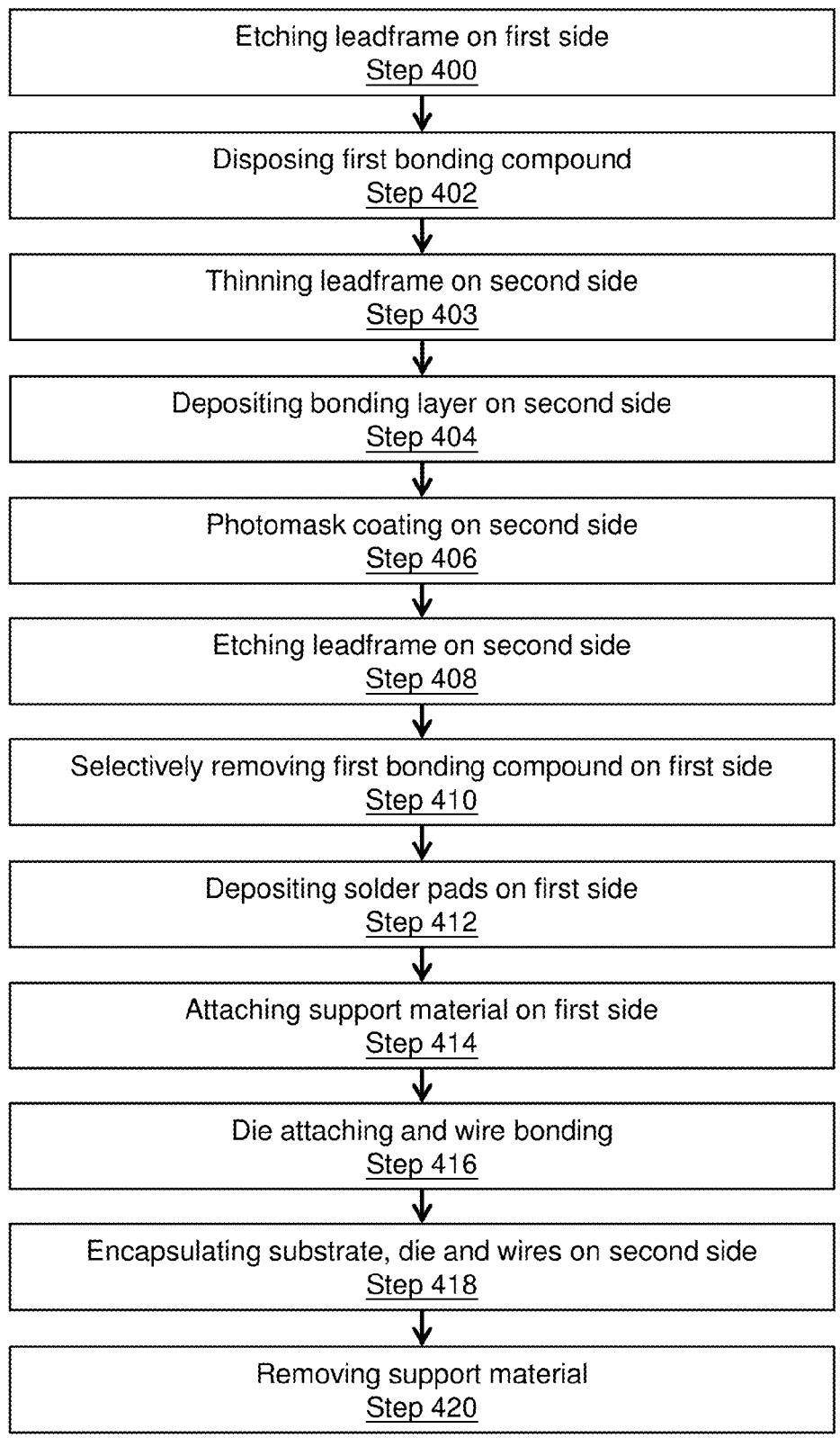
FIG. 7 is a flow chart of a process of manufacturing an integrated circuit chip package according to another embodiment of the present invention.
Figure 8A:
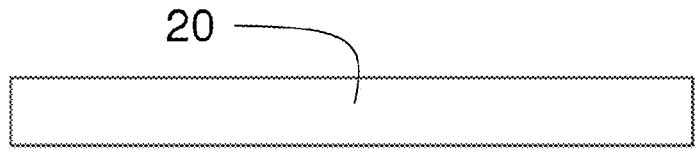
Figure 8B:
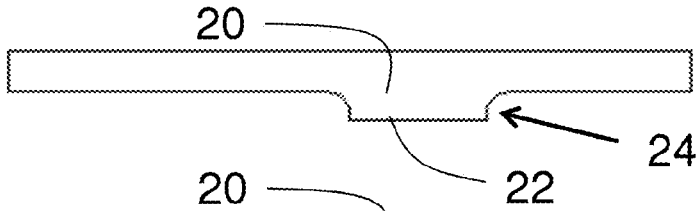
Figure 8C:
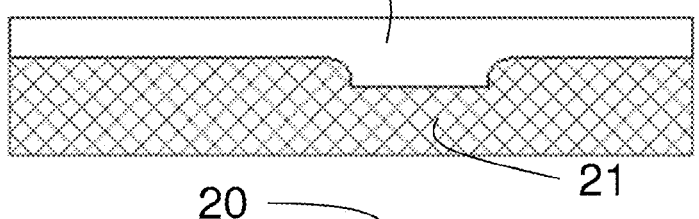
Figure 8D:
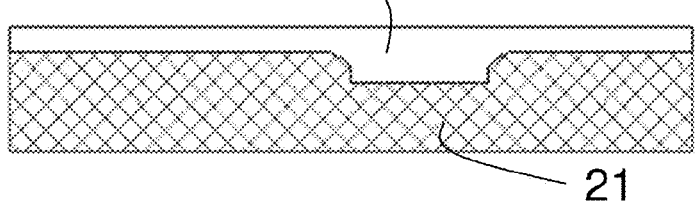
Figure 8E:
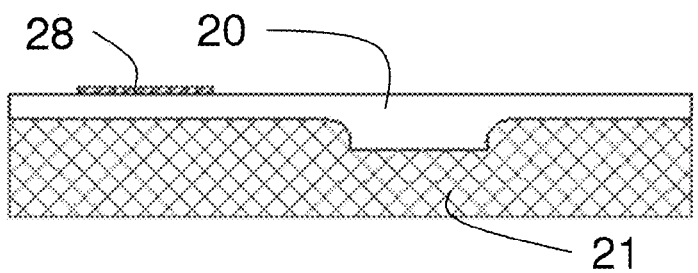
Figure 8F:
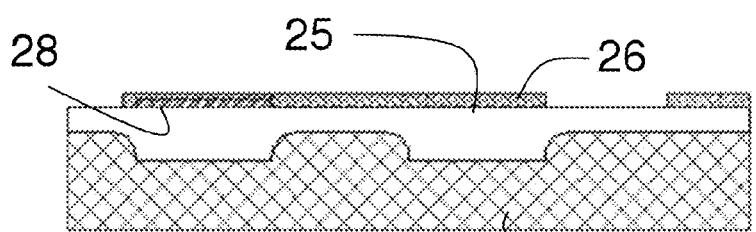
Figure 8G:
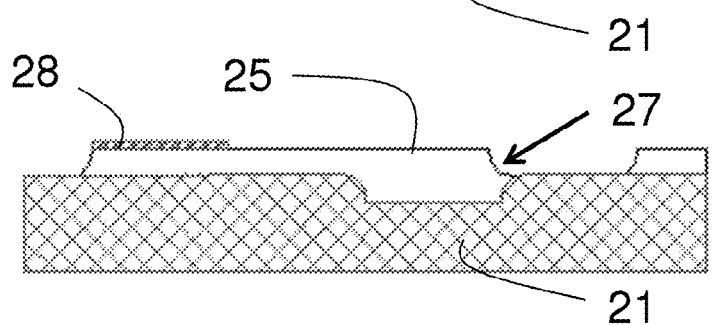
Figure 9:
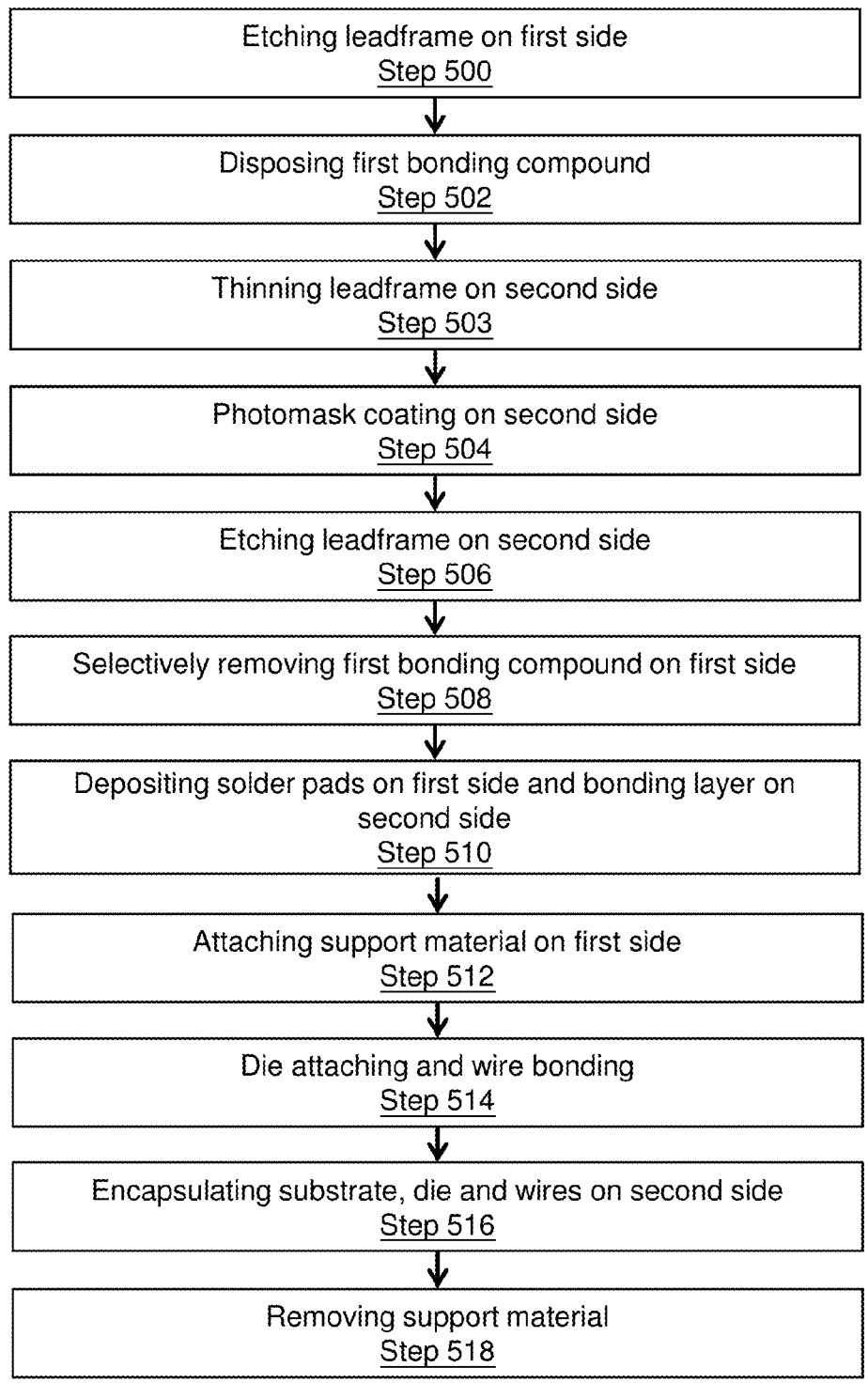
FIG. 9 is a flow chart of a process of manufacturing an integrated circuit chip package according to another embodiment of the present invention.

In another embodiment of the present invention as shown in FIG. 6k, the IC package comprises an electrically conductive lead frame leadframe 20. The leadframe 20 comprises a plurality of lands 22 on a first side of the leadframe with a first recessed portion 24 between lands 22 and a plurality of routing leads 25 on a second side of the leadframe with a second recessed portion 27 between the routing leads 25. Each land 22 is electrically connected to a corresponding routing lead 25. A bonding pad 28 is disposed on a bonding site of each routing lead 25.

The IC package also comprises a first bonding compound 21 filling the first recessed portion 24. The IC package comprises a semiconductor die 30 with bonding wires 32 electrically connecting the semiconductor die 30 to the bonding pads 28, and an encapsulation compound 34 filling the second recessed portion 27, and also covering the plurality of routing leads 25, the plurality of bonding pads 28, the semiconductor die 30 and the bonding wires 32. The first bonding compound 21 contacts with the encapsulation compound 34 at areas common to the first recessed portion 24 and the second recessed portion 27. The IC package further comprises a support material 38 attached to the first side of the leadframe substrate, covering the first bonding compound 21 and the lands 22. The second support material 38 supports the substrate in the manufacturing process and is selected to be easily removable.

In another embodiment as shown in FIG. 8l, the IC package further comprises solder pads 36 disposed on the lands 22. The support material 38 covers the first bonding compound 21 and the solder pads 36. This IC package is ready for attaching to a PCB upon removing the support material 38 from the IC package.

Figure 12A:
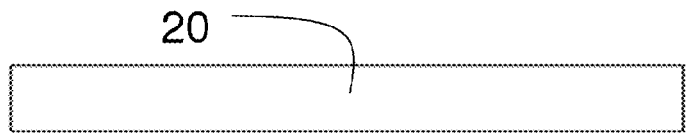
FIG. 12a-12k is a cross-sectional view of an integrated circuit chip package at different steps of the process of FIG. 11.
Figure 12B:
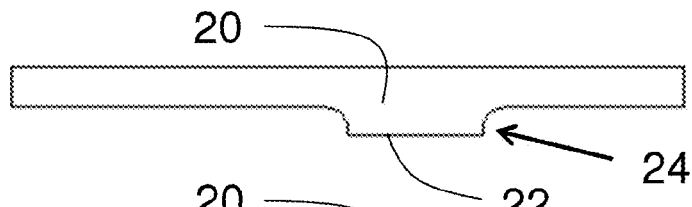
Figure 12C:
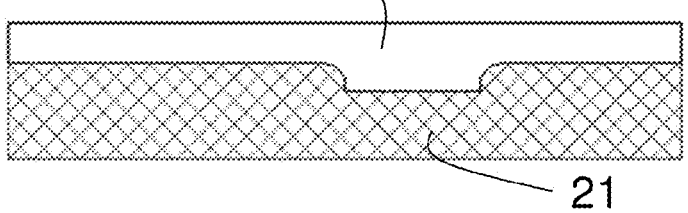
Figure 12D:
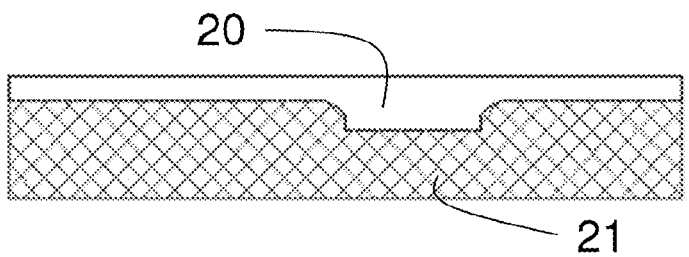
Figure 12E:
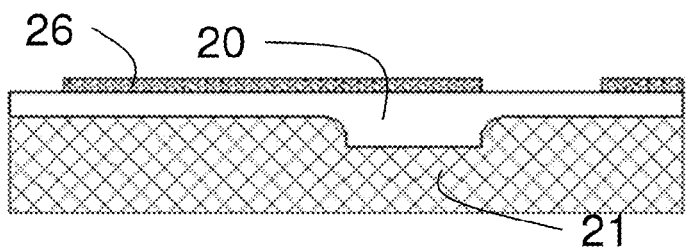
Figure 12F:
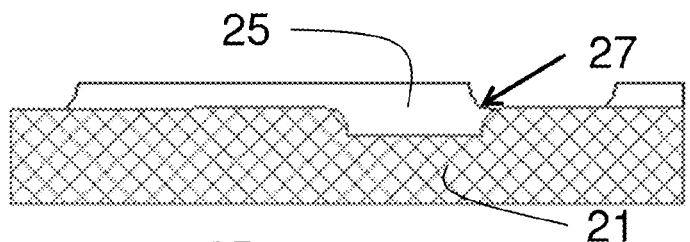
Figure 12G:
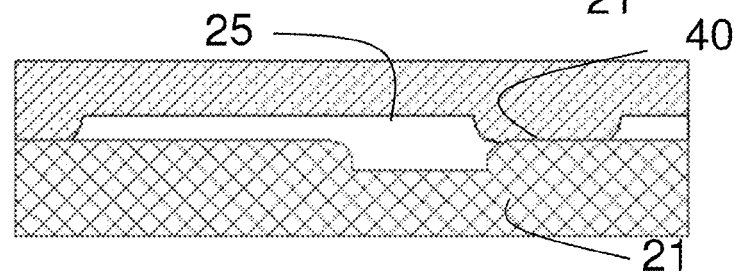
Figure 12H:
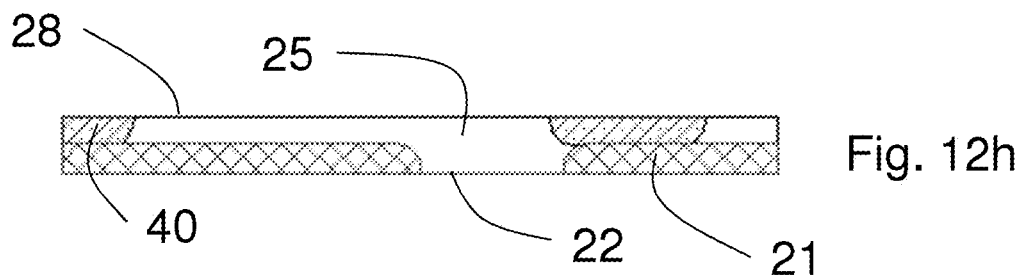
Figure 12I:
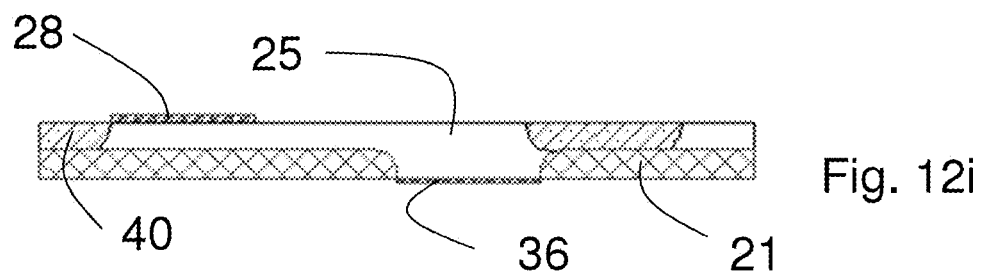
Figure 12J:
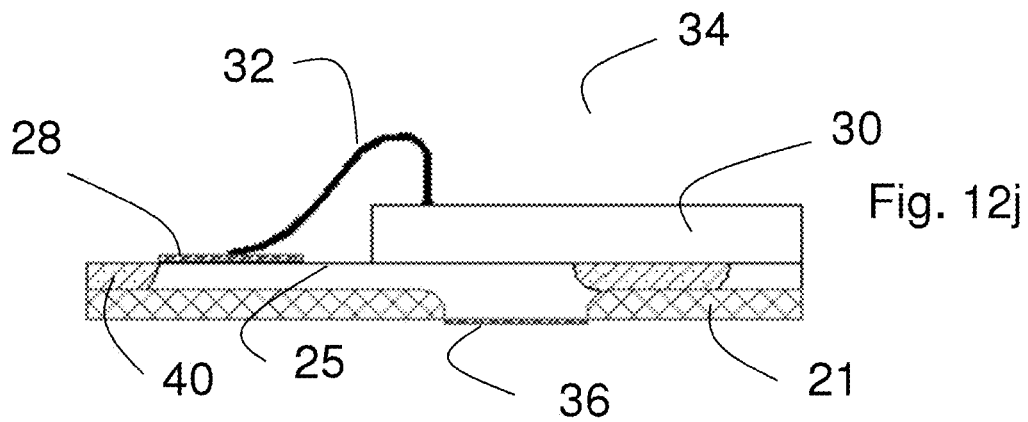
Figure 12K:
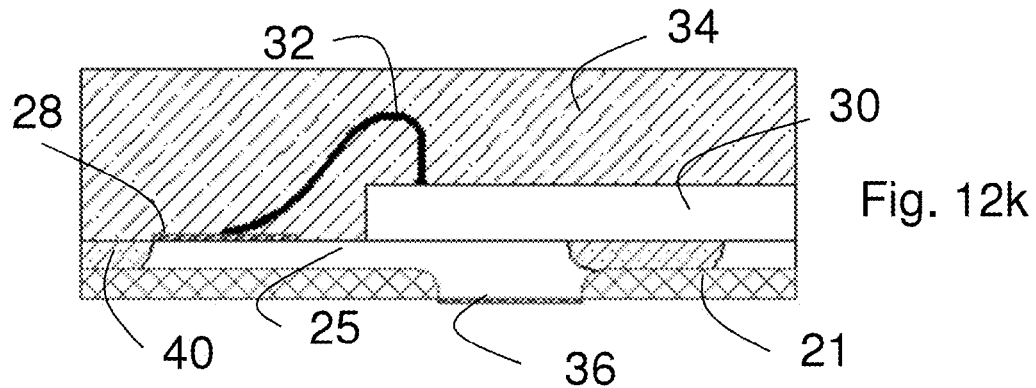

In yet another embodiment of the IC package as shown in FIG. 12k, the IC package comprises an electrically conductive lead frame leadframe 20. The leadframe 20 comprises a plurality of lands 22 on a first side of the leadframe with a first recessed portion 24 between lands 22 and a plurality of routing leads 25 on a second side of the leadframe with a second recessed portion 27 between the routing leads 25. Each land 22 is electrically connected to a corresponding routing lead 25. A bonding pad 28 is disposed on a bonding site of each routing lead. A solder pad 36 is disposed on each land 22.

The IC package also comprises a first bonding compound 21 filling the first recessed portion 24, and a second bonding compound 40 filling the second recessed portion 27. The first bonding compound 21 is in contact with the second bonding compound 40 at areas common to the first recessed portion 24 and the second recessed portion 27. The IC package comprises a semiconductor die 30 with bonding wires 32 electrically connecting the semiconductor die 30 to the bonding pads 28, and an encapsulation compound 34 covering the second bonding compound 40, the plurality of bonding pads 28, the semiconductor die 30 and the bonding wires 32. The IC package is ready to be bonded to an external printed circuit board through the solder pads 36.

In one embodiment, the IC package also comprises a die attach material in a predetermined area between the second side of the leadframe 20 and the semiconductor die 30. In one embodiment, the die attach material is provided on the routing leads 25 within the predetermined area of the leadframe 20. In another embodiment, the die attach material is provided on the routing leads 25 and also fills the second recessed portion 27 between the routing leads 25 within the predetermined area.

Figure 13:
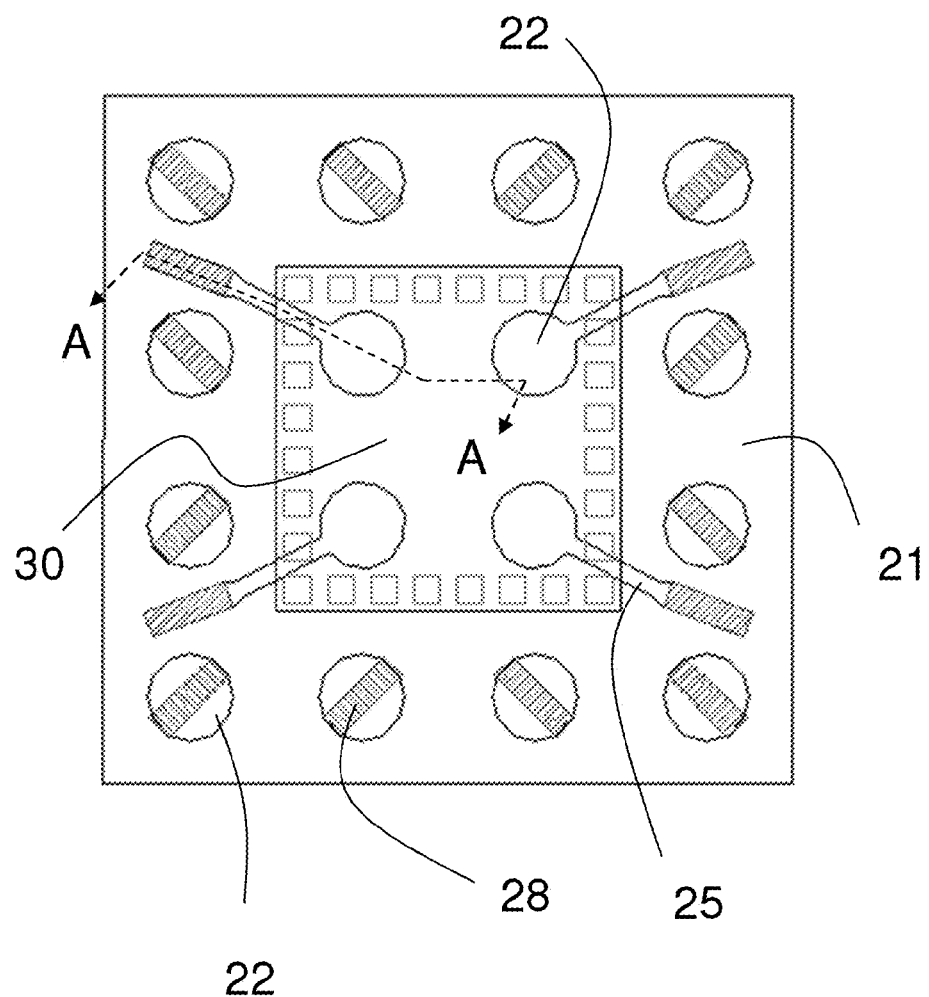
FIG. 13 is a top view of the substrate at FIG. 2g.

In another aspect of the invention, a substrate for manufacturing an IC package is provided. A top view of the substrate is shown in FIG. 13, where the cross section along the line A-A is shown in FIG. 2g. The expected area for attachment of the semiconductor die is also shown in FIG. 13 for reference. The substrate comprises an electrically conductive leadframe 20. The leadframe 20 comprises a plurality of lands 22 on a first side of the leadframe with a first recessed portion 24 between lands 22 and a plurality of routing leads 25 on a second side of the leadframe with a second recessed portion 27 between the routing leads 25. Each land 22 is electrically connected to a corresponding routing lead 25. A bonding pad 28 is disposed on a bonding site of each routing lead 25. The substrate further comprises a first bonding compound 21, the first bonding compound 21 having a first portion filling the first recessed portion 24, and a second portion covering the first portion and the lands 22 at the first side of the leadframe 20. The first bonding compound 21 is exposed at the second side of the leadframe 20 at areas common to the first recessed portion 24 and the second recessed portion 27.

In another embodiment as shown in FIG. 6i, the first bonding compound 21 only has a first portion filling the first recessed portion 24. The substrate further comprises a support material 38 covering the first bonding compound 21 and the lands 22 at the first side of the leadframe 20.

In another embodiment as shown in FIG. 8j, the substrate further comprises solder pads 36 disposed on the lands 22. The support material 38 covers the first bonding compound and the solder pads 36 at the first side of the leadframe.

In yet another embodiment as shown in FIG. 12i, the substrate comprises an electrically conductive leadframe 20. The leadframe 20 comprises a plurality of lands 22 on a first side of the leadframe 20 with a first recessed portion 24 between lands 22 and a plurality of routing leads 25 on a second side of the leadframe 20 with a second recessed portion 27 between the routing leads 25. Each land 22 is electrically connected to a corresponding routing lead 25. A bonding pad 28 is disposed on a bonding site of each routing lead 25. The substrate further comprises a first bonding compound 21, the first bonding compound 21 having a first portion filling the first recessed portion 24. The substrate also comprises a second bonding compound 40 filling the second recessed portion 27. The second bonding compound 40 is in contact with the first bonding compound 21 at areas common to the first recessed portion 24 and the second recessed portion 27.

In one embodiment, the IC package also comprises a die attach material in a predetermined area on the second side of the leadframe 20. In one embodiment, the die attach material is provided on the routing leads 25 within the predetermined area of the leadframe 20. In another embodiment, the die attach material is provided on the routing leads 25 and also fills the second recessed portion 27 between the routing leads 25 within the predetermined area. In another embodiment, a first die attach material is disposed on the routing leads 25 and a second die attach material is provided filling the second recessed portion 27.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

For example, the first bonding compound 21 can also be removed by other means than mechanical polishing to expose the lands 22, such as etching.

Although the embodiments showed that the steps are performed in a particular sequence, one skilled in the art can modify the sequence to his desire without departing from the scope of the invention. For example, it is known to one skilled in the art that solder pads 36 can be disposed at any stage where the lands 22 are exposed, for example after selectively removing the first bonding compound 21, or after attaching and removing the support material 38.

In one embodiment, the bonding pads 28 are disposed before the defining of the routing leads 25. In such case, the bonding pads 28 can be disposed using electrolytic plating in addition to electroless plating technique.

In one embodiment, the first portion and the second portion of the first bonding compound 21 is disposed in separate steps instead of in a single step.

What is claimed is:

1. A method of manufacturing a substrate for an integrated circuit package, comprising the steps of:
    a) patterning a leadframe on a first side forming a plurality of lands and a first recessed portion between said plurality of lands;
    b) disposing a first bonding compound on said first side of said leadframe, said first bonding compound having a first portion filling said first recessed portion;
    c) patterning said leadframe on an opposing second side forming a plurality of electrically isolated routing leads and a second recessed portion between said plurality of routing leads;
    d) disposing a second bonding compound on said second side of said leadframe filling at least a portion of said second recessed portion; and
    e) disposing a plurality of bonding pads on said plurality of routing leads;

whereby said first bonding compound prevents displacement of said plurality of routing leads; and combination of said first bonding material and said second bonding material hold metal features in place during assembly processes of die attach, die to substrate interconnection and encapsulation molding.

2. The method according to claim 1, wherein a lateral extent of said plurality of bonding pads is larger than the size of at least one semiconductor die adapted to attached thereto.

3. The method according to claim 1, wherein said first bonding compound is an epoxy with a coefficient of thermal expansion between 7 and 15.

4. The method according to claim 1, wherein said first bonding compound is an engineered epoxy, a thermoset or a thermoplastic compound.

5. The method according to claim 1, wherein said second bonding compound has a coefficient of thermal expansion between that of said first bonding compound and a semiconductor die adapted to attach thereto.

6. The method according to claim 1, wherein said second bonding compound further covers said routing leads, said method further comprises a step of selectively removing said second bonding compound to expose said routing leads.

7. The method according to claim 1, further comprising a step of attaching a support material on said first side of said leadframe, said support material attached to and supporting said plurality of lands, wherein a plurality of solder pads is disposed on said plurality of lands before said step of attaching said support material, such that said support material further covers said plurality of solder pads.

8. The method according to claim 1, wherein said first bonding compound further comprises a second portion extending over said first recessed portion and said leadframe, covering said plurality of lands.

9. The method according to claim 1, further comprising a step of selectively disposing a non-conductive die attach material onto said routing leads within a predetermined area of said second side of said leadframe.

10. The method according to claim 1, further comprising a step of selectively disposing a non-conductive die attach material onto a predetermined area of said second side of said leadframe, said non-conductive die attach material being disposed on said routing leads within said predetermined area and also filling said second recessed portion between routing leads within said predetermined area.

11. The method according to claim 1, wherein said patterning a leadframe on a first side step further forms a support ring surrounding each individual unit in said leadframe.

12. The method according to claim 1, wherein said at least one of said first bonding compound and second bonding compound is made of a photolithographic material.

13. The method according to claim 1, wherein said first bonding compound is made of an epoxy material and said second bonding compound is made of a photolithographic material.

14. The method according to claim 1, wherein a lateral extend of at least one of said plurality of routing leads is disposed between said plurality of lands and is connected to said land laterally disposed.

15. The method according to claim 1, wherein said patterning a leadframe on a first side step further forms a support ring surrounding each individual package site in a substrate strip with said support ring having no connection to any of said metal features within said individual package site and said method further comprise a step of removing said support ring from said substrate.

16. The method according to claim 1, wherein said second bonding compound is first disposed filling said second recessed portions and covering said routing leads, and then selectively removed to expose said routing leads.

17. A method of manufacturing an integrated circuit package, comprising the steps of:
 a) providing a substrate comprising the steps of:
  i patterning a leadframe on a first side forming a plurality of lands and a first recessed portion between said plurality of lands;
  ii disposing a first bonding compound on said first side leadframe, said first bonding compound having a first portion filling said first recessed portion;
  iii patterning said leadframe on an opposing second side forming a plurality of electrically isolated routing leads and a second recessed portion between said plurality of routing leads; and
  iv disposing a plurality of bonding pads on said plurality of routing leads;
  whereby said first bonding compound prevents displacement of said plurality of routing leads;
 b) attaching at least one semiconductor die onto said second side of said substrate;
 c) electrically connecting said semiconductor die to said plurality of bonding pads through bonding wires; and
 d) encapsulating said semiconductor die, said bonding wires and said substrate on said second side.

18. The method according to claim 17 further comprising a step of disposing a second bonding compound on said second side of said leadframe, said second bonding compound filling said second recessed portion.

19. The method according to claim 18, wherein said at least one of said first bonding compound and second bonding compound is made of a photolithographic material.

20. The method according to claim 18, wherein said first bonding compound is made of an epoxy material and said second bonding compound is made of a photolithographic material.

21. The method according to claim 18, further comprising a conductive die attach material selectively disposed over said second bonding material within a predetermined area of said second side of said leadframe.

22. The method according to claim 17, further comprising a step of attaching a support material on said first side of said substrate, said support material attached to and supporting said plurality of lands; wherein said support material is de-attached from said substrate after said encapsulating step.

23. The method according to claim 17, wherein said first bonding compound further comprises a second portion extending over said first portion and said leadframe, covering said plurality of lands, said method further comprises a step of selectively removing said first bonding compound such that said second portion is removed while said first portion remains disposed on said leadframe.

24. The method according to claim 17, further comprising a step of selectively disposing a non-conductive die attach material onto said routing leads within a predetermined area of said second side of said substrate.

25. The method according to claim 17, further comprising a step of selectively disposing a non-conductive die attach material onto a predetermined area of said second side of said leadframe, said non-conductive die attach material being disposed on said routing leads within said predetermined area and also filling said second recessed portion between routing leads within said predetermined area.

26. The method according to claim 17, wherein a lateral extent of said plurality of bonding pads is larger than the size of said semiconductor die.

27. The method according to claim 17, wherein said first bonding compound has a coefficient of thermal expansion between 7 and 15.

28. The method according to claim 17, wherein said patterning a leadframe on a first side step further forms a support ring surrounding each individual unit in said leadframe, said method further comprise a step of removing said support ring from said leadframe after said encapsulated step.

29. The method according to claim 17, wherein a lateral extent of at least one of said plurality of routing leads is disposed between two land features and is connected to said land laterally disposed.

30. The method according to claim 17, wherein said first patterning step further forms a support ring surrounding each individual package site in a substrate strip with said support ring having no connection to any metal features within said individual package site and said method further comprises step of removing said support ring from said substrate.

31. A method of manufacturing a substrate for an integrated circuit package, comprising the steps of:
a) patterning a leadframe on a first side forming a plurality of lands, a first recessed portion between said plurality of lands, and a support ring surrounding each individual unit in said leadframe;
b) disposing a first bonding compound on said first side of said leadframe, said first bonding compound having a first portion filling said first recessed portion;
c) patterning said leadframe on an opposing second side forming a plurality of routing leads, a second recessed portion between said plurality of routing leads, at least one said routing lead comprising a tie bar connecting said routing lead to said support ring;
d) disposing a second bonding compound on said second side of said leadframe filling at least a portion of said second recessed portion; and
e) disposing a plurality of bonding pads on said plurality of routing leads;

whereby said first bonding compound and said tie bar prevents displacement of said plurality of routing leads; and combination of said first bonding material and said second bonding material hold metal features in place during assembly processes of die attach, die to substrate interconnection and encapsulation molding.

32. The method according to claim 31, wherein said first bonding compound is made of an epoxy material and said second bonding compound is made of a photolithographic material.

* * * * *